United States Patent
Mandelman et al.

(10) Patent No.: US 7,459,743 B2
(45) Date of Patent: Dec. 2, 2008

(54) DUAL PORT GAIN CELL WITH SIDE AND TOP GATED READ TRANSISTOR

(75) Inventors: Jack A. Mandelman, Flat Rock, NC (US); Kangguo Cheng, Beacon, NY (US); Ramachandra Divakaruni, Ossining, NY (US); Carl J. Radens, LaGrangeville, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 11/161,962

(22) Filed: Aug. 24, 2005

(65) Prior Publication Data

US 2007/0047293 A1    Mar. 1, 2007

(51) Int. Cl.
H01L 27/108 (2006.01)
H01L 29/76 (2006.01)
H01L 29/94 (2006.01)
H01L 31/119 (2006.01)

(52) U.S. Cl. ............... 257/300; 257/301; 257/304; 257/E27.092

(58) Field of Classification Search ............... 257/300, 257/301, 304, E27.092
See application file for complete search history.

(56) References Cited

U.S. PATENT DOCUMENTS

| 4,763,181 | A | | 8/1988 | Tasch, Jr. |
|---|---|---|---|---|
| 5,220,530 | A | * | 6/1993 | Itoh .................. 365/189.01 |
| 5,675,160 | A | * | 10/1997 | Oikawa .................. 257/296 |
| 5,732,014 | A | | 3/1998 | Forbes |
| 6,314,017 | B1 | * | 11/2001 | Emori et al. ............ 365/149 |
| 6,804,142 | B2 | * | 10/2004 | Forbes .................. 365/149 |

FOREIGN PATENT DOCUMENTS

| JP | 7045716 A | 2/1995 |
|---|---|---|
| JP | 2001230329 A | 8/2001 |

* cited by examiner

Primary Examiner—Ngan Ngo
(74) Attorney, Agent, or Firm—Scully, Scott, Murphy & Presser, P.C.; Todd M. C. Li, Esq.

(57) ABSTRACT

A DRAM memory cell and process sequence for fabricating a dense (20 or 18 square) layout is fabricated with silicon-on-insulator (SOI) CMOS technology. Specifically, the present invention provides a dense, high-performance SRAM cell replacement that is compatible with existing SOI CMOS technologies. Various gain cell layouts are known in the art. The present invention improves on the state of the art by providing a dense layout that is fabricated with SOI CMOS. In general terms, the memory cell includes a first transistor provided with a gate, a source, and a drain respectively; a second transistor having a first gate, a second gate, a source, and a drain respectively; and a capacitor having a first terminal, wherein the first terminal of said capacitor and the second gate of said second transistor comprise a single entity.

20 Claims, 19 Drawing Sheets

C-C

A-A

C-C

A-A

C-C

A-A

A-A

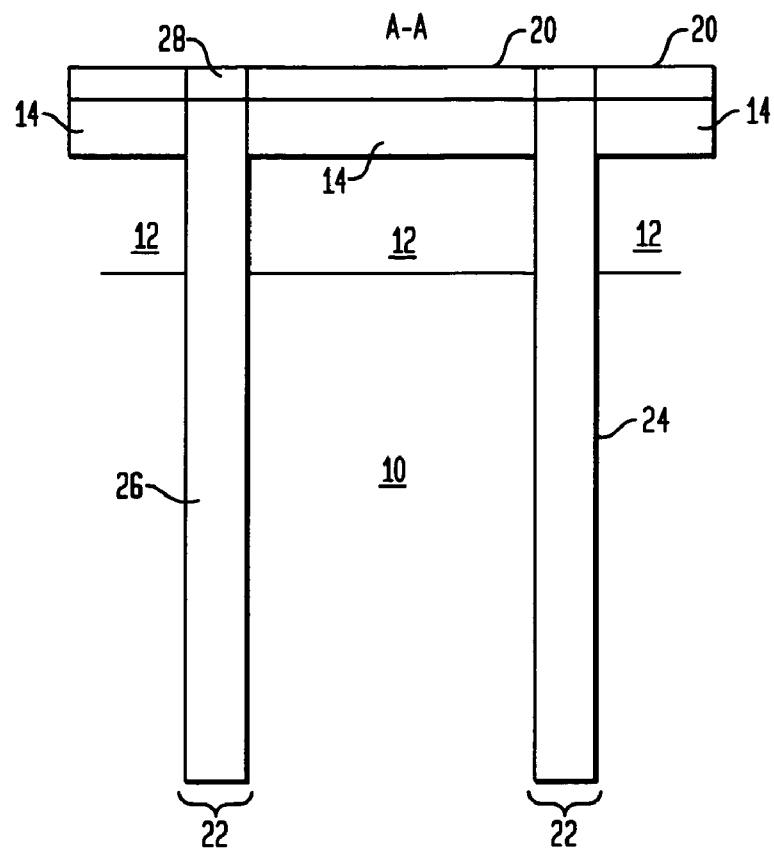
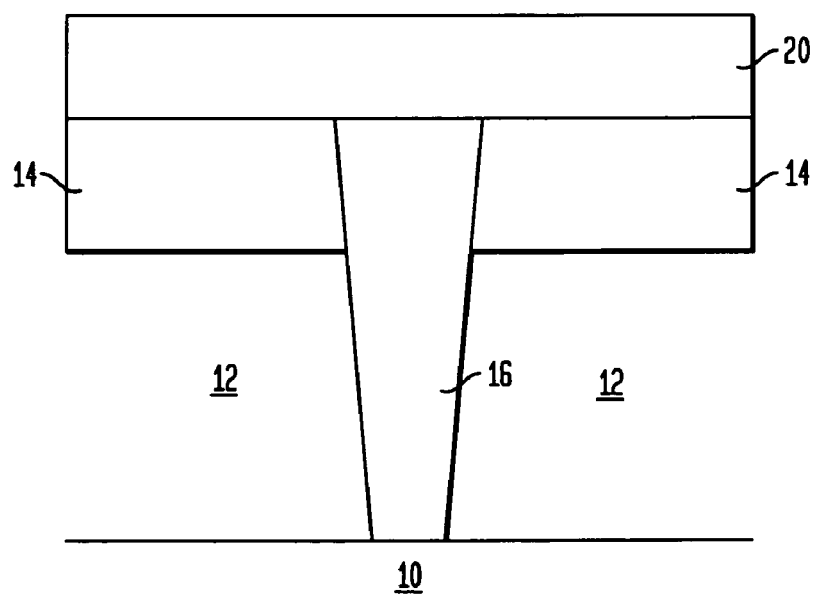

DUAL PORT GAIN CELL WITH SIDE AND TOP GATED READ TRANSISTOR

FIELD OF THE INVENTION

The present invention relates to a semiconductor memory cell and a method of fabricating the same. More particularly, the present invention relates to a dense, high-performance dynamic random access memory (DRAM) cell that is compatible with existing complementary metal oxide semiconductor (CMOS) technologies.

BACKGROUND OF THE INVENTION

Current advances in performance of microprocessors have outpaced the performance of DRAM. Because of this speed disparity, it is increasingly important to provide increasingly large amounts of cache memory on the microprocessor chip in order to meet the memory bandwidth requirements of contemporary applications. Static random access memory (SRAM) has historically been used for cache memory on processor chips because of its relative ease of process integration. However, because of the need for larger amounts of on-chip memory, the size of the SRAM cell has made its use less attractive. As SRAM memory occupies an increasingly larger percentage of chip area, it becomes a principal determinant of chip size, yield and cost per chip. Therefore, interest in using dynamic random access memory (DRAM) for on-chip cache memory is increasing, because of its high density, and low cost. However the integration of DRAM with CMOS logic involves increased process complexity because of the competing needs of high-performance low-threshold voltage (Vt) logic devices and low-leakage DRAM array devices. Additionally, DRAM cells require large storage capacitors, which are not provided by standard CMOS logic processes. Furthermore, the cost of providing these large DRAM storage capacitors in a CMOS logic process may be prohibitive for certain applications. As minimum feature size is reduced from generation to generation, it becomes increasingly difficult and costly to obtain the high storage capacitance for DRAM cells.

In view of the above, there is a need in the semiconductor industry to provide a dense, cost effective, replacement for SRAM caches integrated with high-performance logic.

SUMMARY OF THE INVENTION

The present invention provides a DRAM memory cell and process sequence for fabricating a dense (20 or 18 square) layout fabricated with semiconductor-on-insulator (SOI) CMOS technology. Specifically, the present invention provides a dense, high-performance DRAM cell replacement that is compatible with existing SOI CMOS technologies. Various gain cell layouts are known in the art. The present invention improves on the state of the art by providing a dense layout that is fabricated with SOI CMOS.

In broad terms, the present invention provides a memory cell that includes:

a first transistor having a gate, a source, and a drain respectively;

a second transistor having a first gate, a second gate, a source, and a drain respectively; and A capacitor having a first terminal, wherein the first terminal of said capacitor and the second gate of said second transistor comprise a single entity.

In a first embodiment of the present invention, a dense (20 square) single ported memory cell layout is provided. In a second embodiment of the present invention, a dense (18 square) dual port memory cell layout is provided.

As with all gain cells, storage capacitor requirements are greatly relaxed relative to conventional DRAM cells. In the first embodiment of the present invention, a single ported cell layout is provided in which the read metal oxide semiconductor field effect transistor (MOSFET) is doubly gated with a read wordline gate on a top surface and a side-gate which is the node of the storage capacitor. The side-gating by the storage capacitor modulates the threshold voltage (Vt) of the read MOSFET.

When a "1" is stored, the Vt of the read transistor is low. When a "0" is stored, the Vt of the read transistor is high. A "1" is distinguished from a "0" by the resistance of the read MOSFET when the read wordline (RWL) is raised. Thus, low-voltage sensing is feasible, as no transfer of charge between the cell and the bitline is required. The inventive cell of the first embodiment employs three address lines, a write wordline (WWL), a read wordline (RWL) and a bitline (BL). The inventive structure of the first embodiment allows the bitline to be shared for both read and write operations. This represents advancement over prior gain cells which need four address lines: WWL, RWL, a write bitline (WBL) and a read bitline (RBL).

Specifically, and in general terms, the memory cell of the first embodiment of the present invention includes:

a first transistor having a gate, a source, and a drain respectively coupled to a write wordline of a memory array, a first node, and a bitline of said memory array;

a second transistor having a first gate, a second gate, a source, and a drain respectively coupled to a read wordline, to said first node, to a voltage source and said bitline; and a capacitor having a first terminal connected to said first node and a second terminal connected to a voltage source, wherein the first terminal of said capacitor and the second gate of said second transistor comprise a single entity.

In a second embodiment of the present invention, a cell layout is provided in which the read MOSFET is also doubly gated having a read wordline gate on a top surface and a side-gate which is the actual node conductor of the storage capacitor and is directly coupled to the read MOSFET. The side-gating by the storage capacitor in this embodiment also modulates the threshold voltage (Vt) of the read MOSFET.

When a "1" is stored, the Vt of the read transistor is low. When a "0" is stored, the Vt of the read transistor is high. A "1" is distinguished from a "0" by the resistance of the read MOSFET when the read wordline (RWL) is raised. Thus, low-voltage sensing is feasible, as no transfer of charge between the cell and the bitline is required. The inventive cell in the second embodiment is a dual port design, allowing simultaneous write and read of the data from a cell. It is observed that the inventive cell of the second embodiment is distinguished from the cell described in the first embodiment where only a single ported gain cell is employed.

Specifically, and in general terms, the memory cell of the second embodiment of the present invention includes:

a first transistor having a gate, a source, and a drain respectively coupled to a write wordline of a memory array, a first node, and a write bitline of said memory array;

a second transistor having a first gate, a second gate, a source, and a drain respectively coupled to a read wordline, to said first node, to a voltage source and a read bitline; and a capacitor having a first terminal connected to said first node and a second terminal connected to a voltage source, wherein the first terminal of said capacitor and the second gate of said second transistor comprise a single entity.

In accordance with the present invention and in either of the above embodiments, the second transistor contains a first surface and a second surface, wherein the first surface of the second transistor is horizontally oriented, and the second surface of the second transistor is vertically oriented. Moreover, and in accordance with the present invention, the first surface includes a proximal end that is adjacent to a proximal end of the second surface, and a distal end of the first surface is adjacent to a distal end of the second surface. The second transistor of the memory cell of the present invention further includes a source that is located on one of a proximal end or a distal end, and a drain that is located on the other of the proximal end or the distal end.

In further accordance to the present invention, the first gate of the second transistor is disposed on the first surface, and the second gate of the second transistor is disposed on the second surface. It is noted that in the memory cell of the present invention the single entity is a capacitor electrode of a storage node capacitor that is located within an SOI substrate.

The present invention is also directed to a double-gated transistor for use as a read element of a DRAM cell that includes:

a read wordline gate located atop a surface of a storage capacitor, said storage capacitor is located within a semiconductor-on-insulator substrate; and a side-gate located within said semiconductor-on-insulator substrate, said side-gate comprising a node conductor of the storage capacitor.

The present invention also relates to methods of fabricating each of the aforementioned semiconductor structures of the first and second embodiments as well as fabricating the double-gated read wordline transistor.

In broad terms, the method of the present invention includes:

providing a semiconductor-on-insulator substrate that comprises at least one via contact extending through an SOI layer and a buried insulating layer of said semiconductor-on-insulator substrate and at least one storage capacitor including a node conductor;

providing an oxide cap atop a portion of said node conductor, while leaving another portion of said node conductor exposed;

recessing the exposed portion of the node conductor and forming a conductive strap in said recess;

removing the oxide cap and forming a top trench oxide atop a portion of said node conductor and said conductive strap; and forming a read wordline atop the top trench oxide and forming a write wordline atop an exposed surface of said SOI layer, wherein said read wordline includes side-gating and a top gate.

BRIEF DESCRIPTION OF THE DRAWINGS

FIGS. 22A-22C are various views of the initial structure used in the second embodiment after definition of via contacts between the SOI layer and the substrate layer, and after the storage trenches have been lined with a thin dielectric and filled with a node conductor. A block mask is used to implant doped regions surrounding the via contacts. These doped regions are used to form a connection for the read current path under the passing WWL.

DETAILED DESCRIPTION OF THE INVENTION

The present invention will now be described in greater detail by referring to the following discussion with reference to the drawings that accompany the present application. It is observed that the drawings of the present application are provided for illustrative purposes and thus they are not drawn to scale.

Figure 1:
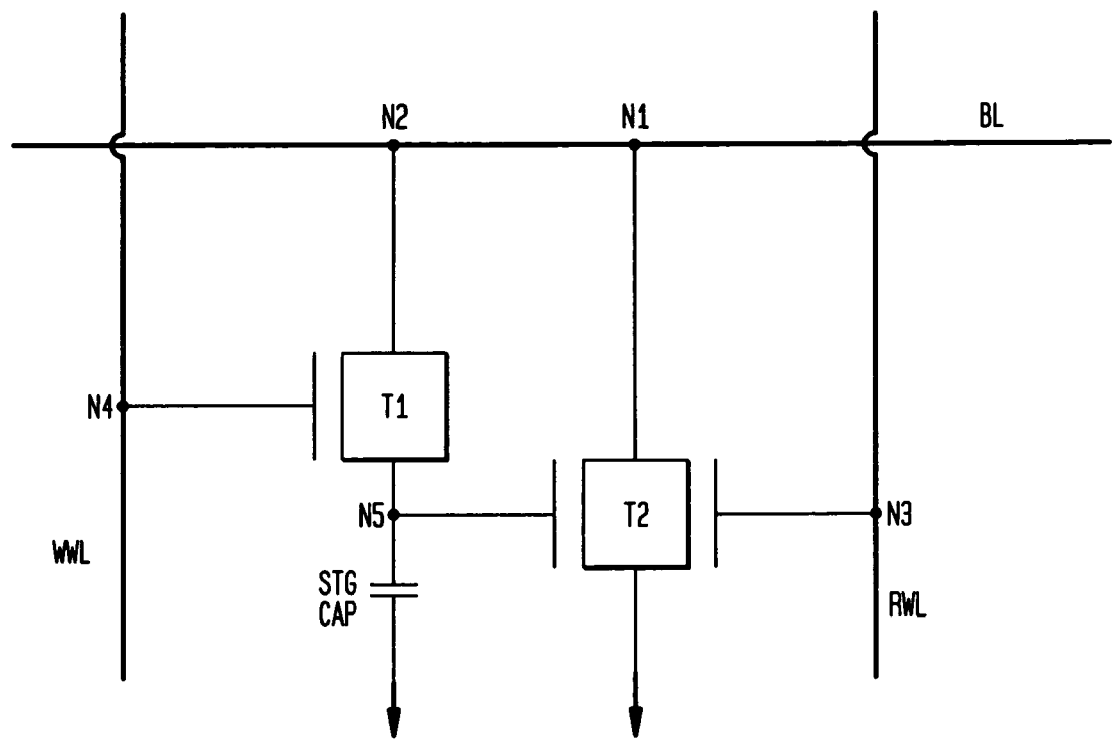
FIG. 1 is a schematic showing a two transistor (2T)/one capacitor (1C) gain cell with a double gated read device in accordance with a first embodiment of the present invention.

Reference is first made to FIG. 1 which shows a schematic representation of a 2T/1C gain cell with a double gated read device in accordance with a first embodiment of the present invention. It is emphasized that in the illustrated gain cell a transistor T2 having two gates is used. Specifically, T2 includes a side-gate that is connected to the storage node of the capacitor (STG CAP) and a top gate which is connected to the read wordline (RWL). In addition to T2, there is also shown T1, which is the write transistor of the cell. It is observed that T1 is a conventional planar MOSFET. In the drawings, BL refers to a common bitline in which T1 and T2 are both in connection with, and WWL refers to the write wordline which is in connection with the gate of T1.

In the cell shown in FIG. 1, a "1" or "0" is written to the storage capacitor, STG CAP, by raising the write wordline (WWL) and transferring charge between the bitline (BL) and the storage capacitor. The node of the storage capacitor serves as one of the two gates of the read MOSFET, i.e., T2. As stated above, the read transistor T2 consists of two gates; a top gate connect to a read wordline and a side-gate connect to the storage node. In this embodiment, the node gating the sidewall of T2 is integrated with the storage capacitor and forms a novel compact structure by itself. This enables the dense cell layout to be formed.

The cell shown in FIG. 1 requires only a single bitline (BL), as read current is sensed from the bitline to ground through T2. Prior art gain cells require two bitlines (read and write bitlines) and are therefore at a layout disadvantage relative to the inventive cell depicted in FIG. 1.

Specifically, FIG. 1 includes a single bitline (BL) having nodes N1 and N2. N1 is the node that couples T2 to BL, while N2 is the node that couples T1 to the BL. Also shown in FIG. I, is write wordline (WWL) and read wordline (RWL) which run perpendicular to the BL. As shown, T1 is coupled to WWL through N4 and T2 is coupled to RWL through N3. N5 is used in coupling T2 to T1. It is further observed that in FIG. 1, T1 is located adjacent to the storage capacitor (STG CAP) on a surface of an SOI substrate and that T2 has a side-gate that is connected to the STG CAP through N5.

Figure 2:
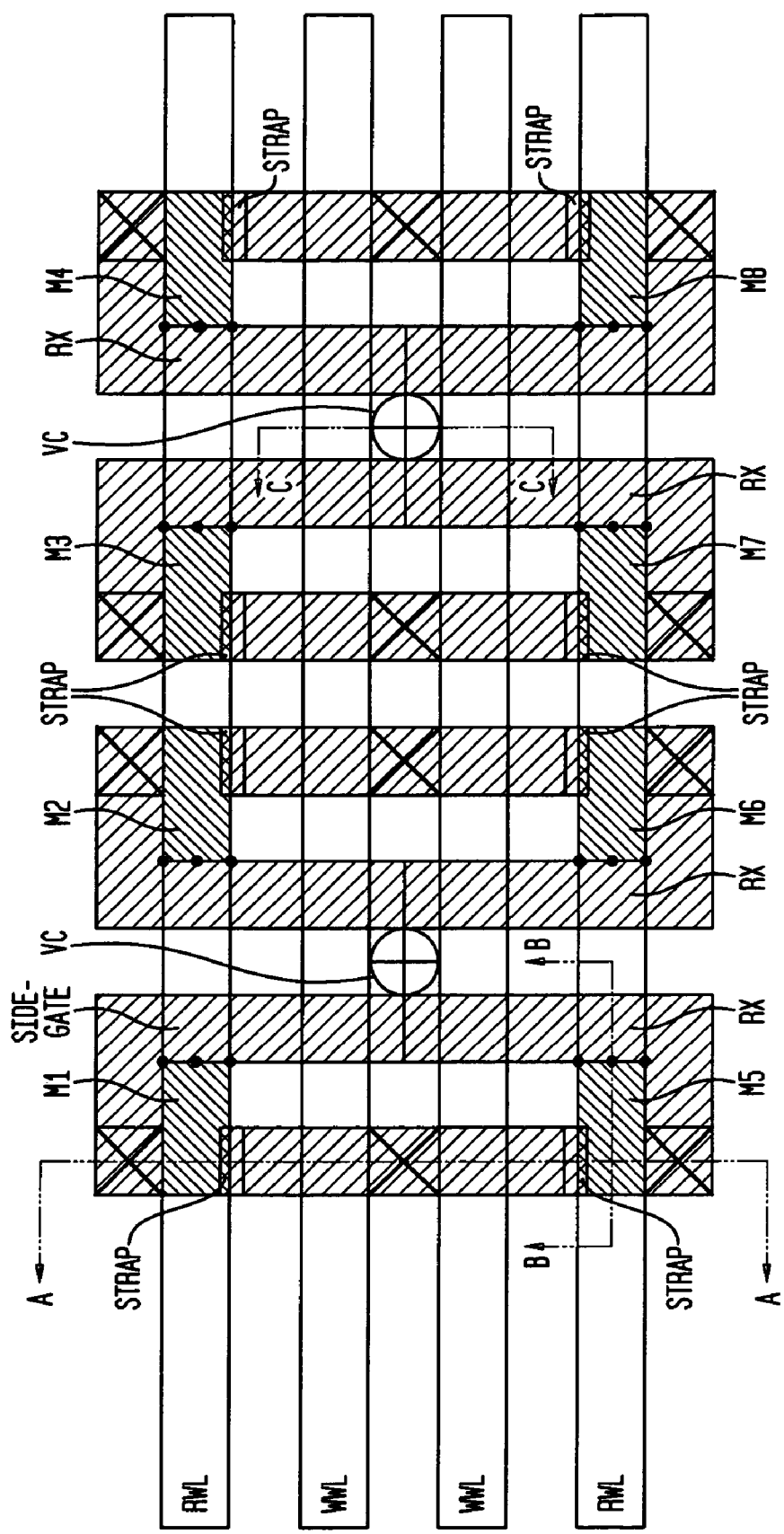
FIG. 2 is a top down view showing the layout of a portion of the memory cell in accordance with the first embodiment of the present invention.

FIG. 2 shows a top down view of the layout of a portion of the memory cell in accordance with the first embodiment of the present invention (it is noted that the bitline conductors have been omitted for clarity). In FIG. 2, eight (8) cells, M1 .

. . M8 are shown. In this layout, a ground contact is provided between an SOI layer and the substrate by a via contact (VC) formed through the back buried insulating layer of the SOI substrate. Each VC is shared by 4 cells and provides a path to ground for the read current. Contacts between bitlines running vertically on the layout (not shown) and the active area (RX) are denoted by an X. Read (RWL) and write (WWL) wordlines run horizontally on the layout. Note the side-gate (denoted by the series of vertical dots) of the read MOSFET, with RWL running over the top gated surface.

The elements shown in FIG. 2 will be described in greater detail herein below. In the drawings, cuts A-A, B-B and C-C are shown. Cut A-A is illustrating the semiconductor structure of the first embodiment along a direction parallel with one of the bitlines. Cut B-B is illustrating the semiconductor structure of the first embodiment of the present invention along a direction parallel with one of the read wordlines. Cut C-C is illustrating the structure of the first embodiment of the present invention through a via contact (VC) in a direction perpendicular to the wordlines.

Each memory cell within the first embodiment of the present invention includes a first transistor T1 provided with a gate, a source, and a drain respectively coupled to a write wordline (WWL) of a memory array, a first node, and a bitline (BL) of said memory array; a second transistor T2 having a first gate, a second gate, a source, and a drain respectively coupled to a read wordline (RWL), to said first node, to a voltage source and said bitline (BL); and a capacitor (STG CAP) having a first terminal connected to said first node and a second terminal connected to a voltage source, wherein the first terminal of said capacitor and the second gate of said second transistor comprise a single entity.

Figure 3:
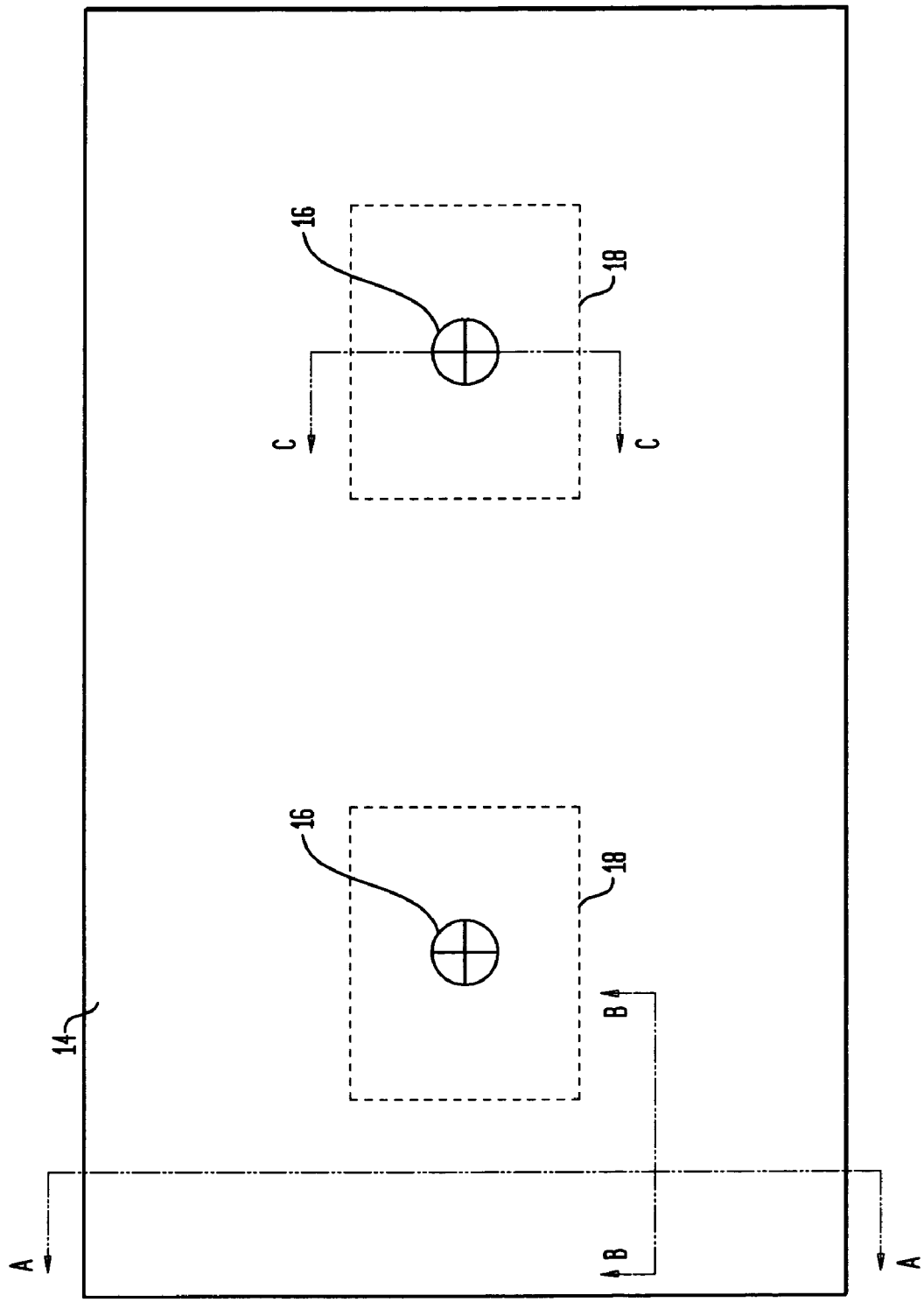
FIGS. 3-19 are pictorial representations (through various views) illustrating the basic processing steps used in forming the 2T/1C gain cell with a double gated read device as described in the first embodiment of the present invention.
Figure 4:
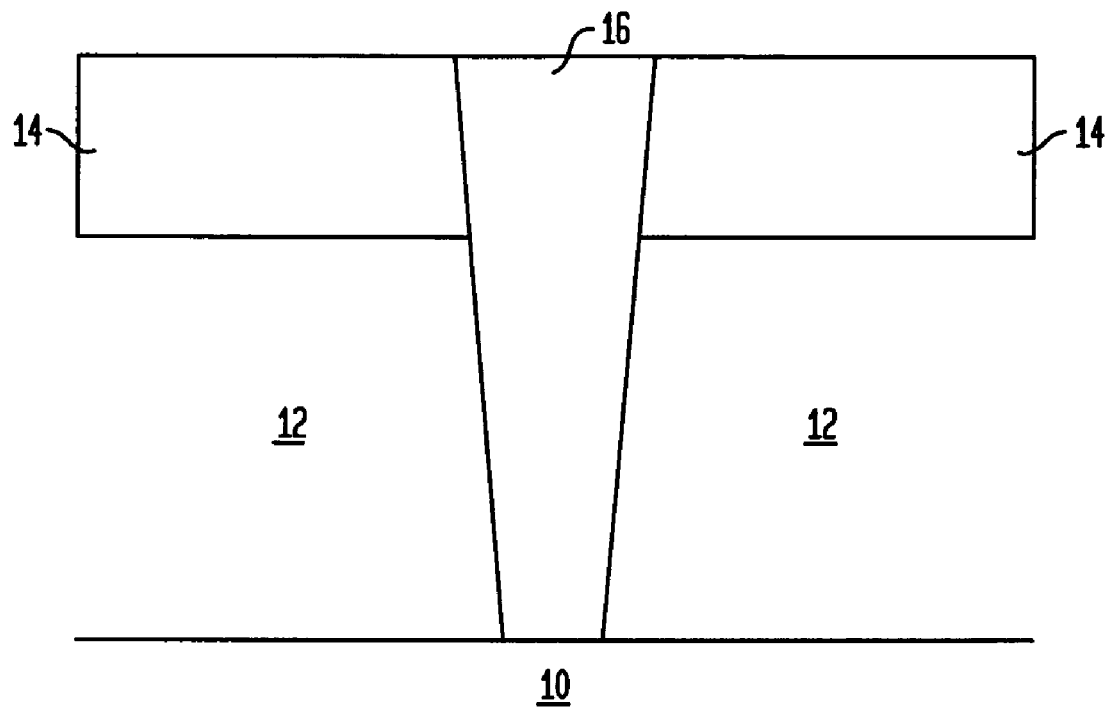

The process flow for fabricating the layout illustrated in FIG. 2 will now be described in greater detail with reference to FIGS. 3-19. Specifically, the layout depicted in FIG. 2 is prepared by first providing the structure shown in FIG. 3 and FIG. 4; FIG. 4 is a cross section through C-C shown in FIG. 3 illustrating the via contact and surrounding doped SOI region 14. Specifically, FIG. 3 and FIG. 4 show an SOI layer 14 of an SOI substrate that has via contacts 16 which connect the SOI layer 14 to the substrate layer 10 through a buried insulating layer 12. The structure also includes block masks 18 that are used in forming a first conductivity type implant region within the SOI layer.

The structure shown in FIG. 3 and FIG. 4 is formed by first providing an SOI (semiconductor-on-insulator) substrate. The top and bottom semiconductor layers may comprise any semiconductor material including, for example, Si, SiGe, SiC, SiGeC, Ge and the like. Preferably, the top and bottom semiconductor layers of the SOI substrate are comprised of Si. The buried insulating layer 12 may comprise a crystalline or non-crystalline oxide or nitride, with crystalline oxides being highly preferred.

The SOI substrate, which includes the bottom substrate layer 10, the buried insulating layer 12 and the SOI layer 14, is formed utilizing conventional techniques that are well known to those skilled in the art. For example, the SOI substrate can be formed by utilizing a layer transfer process that includes at least a wafer bonding process. Alternatively, the SOI substrate can be formed by a process referred to as SIMOX (separation by implantation of oxygen) where oxygen ions are first implanted into a Si substrate and thereafter an annealing step is used to precipitate the implanted oxygen ions into a buried oxide region.

Notwithstanding the technique that can be used in forming the SOI substrate, the SOI layer 14 typically has a thickness from about 20 to about 200 nm, with a thickness from about 40 to about 120 nm being more typical. The thickness of the SOI layer 14 can be obtained directly from the technique used in forming the same, or alternatively, a thinning process such as, for example, chemical mechanical polishing, grinding or oxidation and etching, can be used to provide the SOI layer 14 with a thickness within the ranges recited above. The buried insulating layer 12 typically has a thickness from about 20 to about 400 nm, with a thickness from about 40 to about 150 nm being even more typical. The thickness of the substrate layer 10 is inconsequential to the process of the present invention.

After providing the SOI substrate, a hardmask such as an oxide or nitride (not shown) is formed on an upper surface of the SOI layer 14 using techniques that are well known to those skilled in the art. For example, the hardmask can be formed by a conventional deposition process including, but not limited to: chemical vapor deposition (CVD), plasma enhanced chemical vapor deposition (PCVD), evaporation, chemical solution deposition, sputtering or atomic layer deposition. Alternatively, the hardmask can be formed by a conventional oxidation or nitridation process.

Next, a photoresist (not shown) is applied to an upper surface of the hardmask and then the photoresist is patterned using conventional photolithographic. The photolithographic process includes the steps of exposing the photoresist to a pattern of radiation (in this case a via pattern) and developing the exposed resist using a conventional resist developer. The pattern in the photoresist is first transferred into the hardmask using an etching process and thereafter the patterned photoresist is stripped using a conventional stripping process. The etching step used to transfer the via pattern into the hardmask includes a dry etching process such as, for example, reactive ion etching, ion beam etching or plasma etching. Via contacts 16 are then formed by etching through exposed portions of the SOI layer 14 and the underlying buried insulating layer 12, stopping atop a surface of the substrate layer 10. The etching process used in this step of the present invention may include one of the above mentioned dry etching processes as well as a chemical wet etching process. Combinations of dry etching, wet etching or mixtures of these two types of etching processes are also contemplated in the present invention.

Following the formation of the vias, the vias are then optionally lined with a conductive barrier (not shown) utilizing techniques, such as CVD or PECVD, that are well known in the art. Illustrative examples of some conductive barriers that can be used for lining the vias include, but are not limited to: titanium nitride, tantalum nitride, tantalum silicon nitride or other like materials that can prevent outdiffusion of conductive material from the via into the substrate from occurring. The conductive barrier is used to inhibit propagation of crystal defects from the via into the single crystal substrate.

The via, with or without the optional diffusion barrier, is then filled with polysilicon having a first conductivity type, i.e., n-doped polysi or p-doped polysi. Preferably, n-doped polysilicon is used to fill the vias. The filling of the vias with doped polysilicon may comprise an in-situ doping deposition process or deposition followed by ion implantation may be used. After the fill step, the doped polysilicon is planarized by a conventional planarization process such as chemical mechanical polishing (CMP) and recessed by a timed etching process such as reactive ion etching such that an upper surface of the doped polysilicon is substantially coplanar with an upper surface of the SOI layer 14. In addition to doped polysilicon, the present invention also contemplates using a conductive metal, conductive metal alloy, conductive metal silicide or conductive metal nitride in place of, or in conjunction with, doped polysilicon.

After forming the via contacts 16 into the SOI substrate, a layer of photoresist is applied and patterned by block mask 18 as is also shown in FIG. 3. First conductivity dopants, preferably, n-type dopants, are then implanted into regions of the SOI layer 14 that do not include block mask 18. This implantation step is performed using conventional ion implantation processing. The implant region 19 which is shown in FIG. 5 surrounds the via contact 16 and forms a bridge under the WWL for continuity to the via contact 16.

Figure 5:
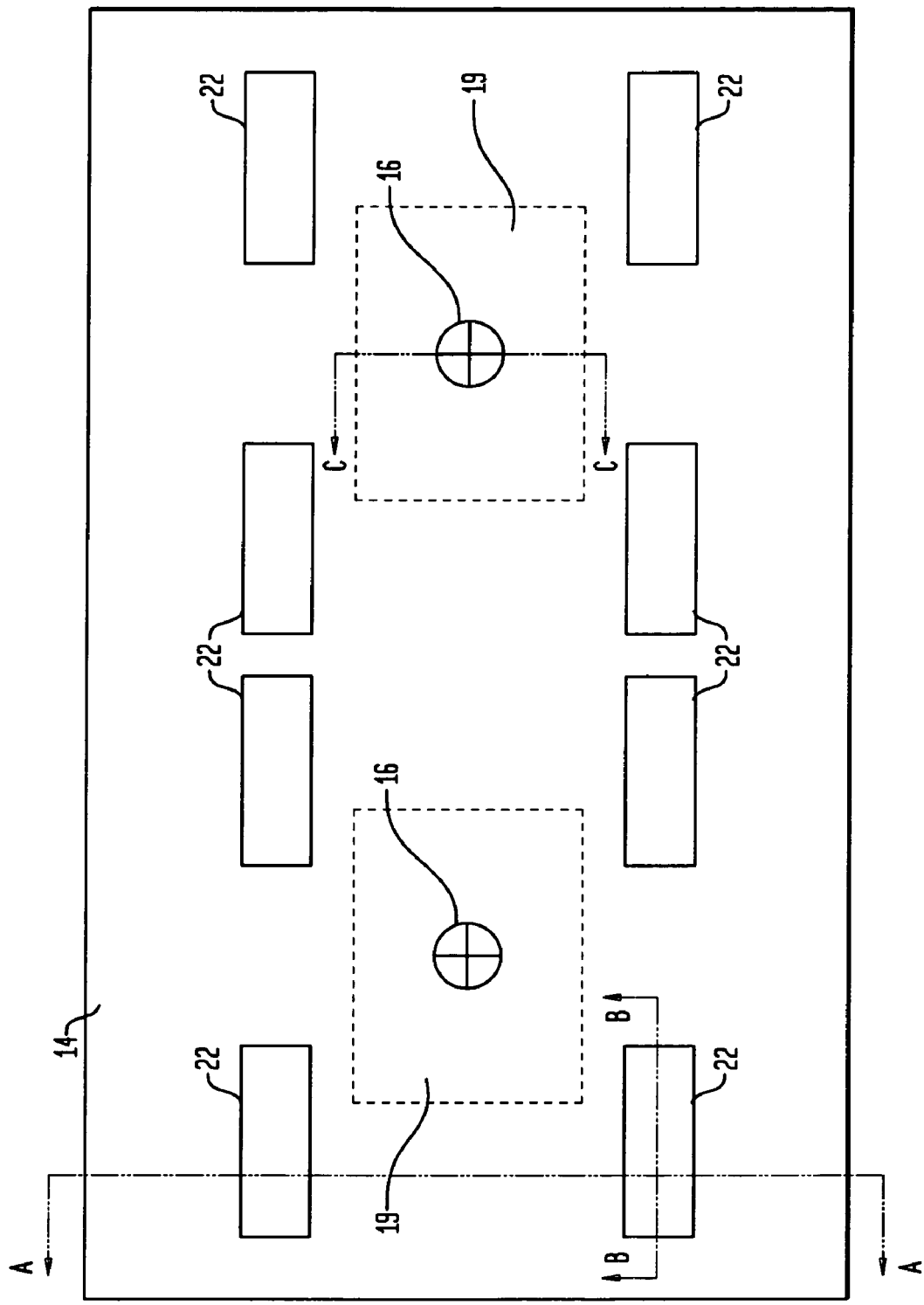
Figure 6:
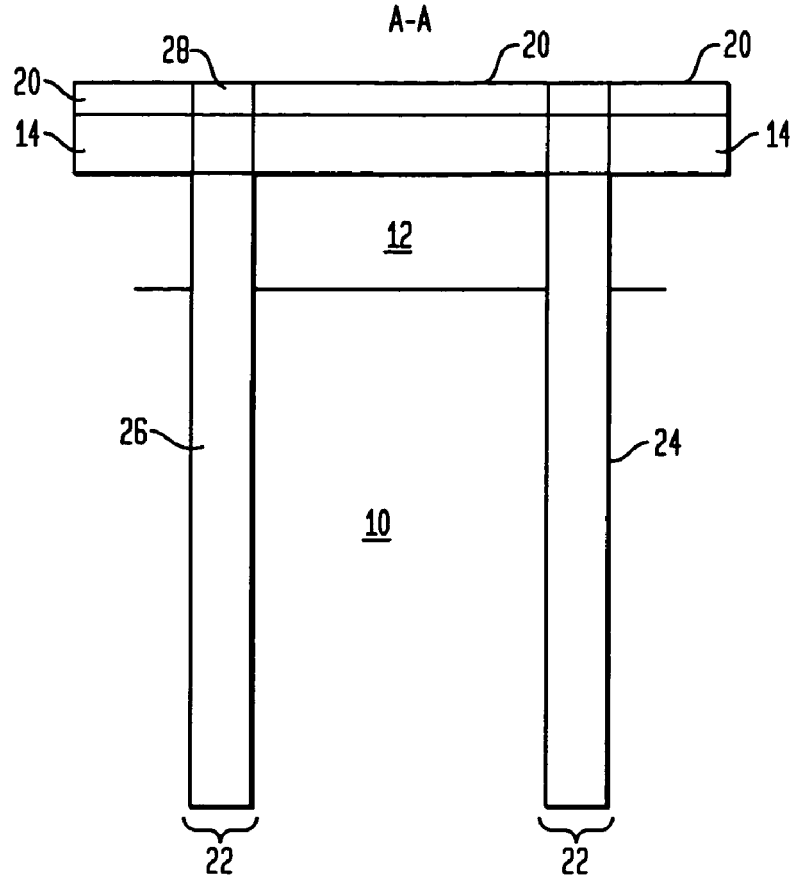
Figure 7:
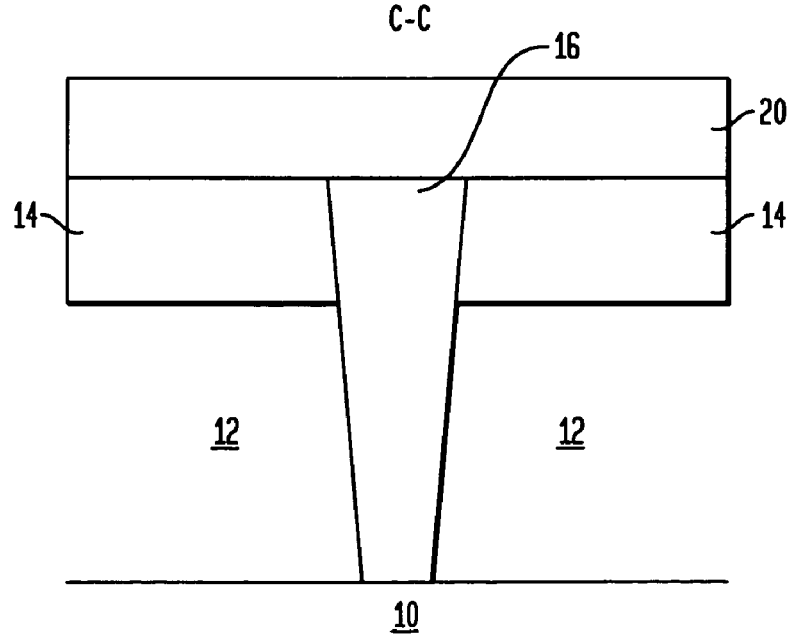
Figure 8:
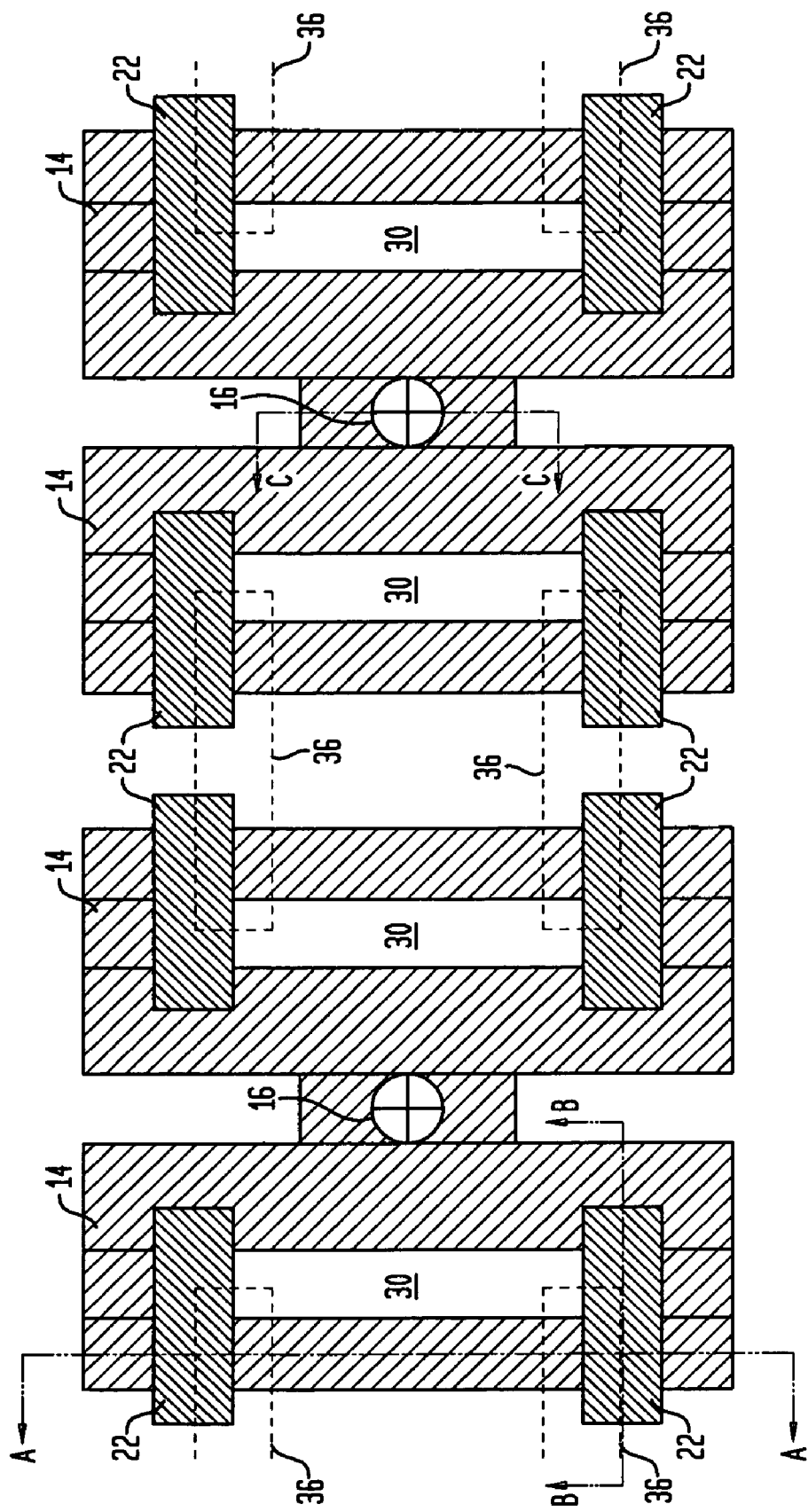
Figure 9:
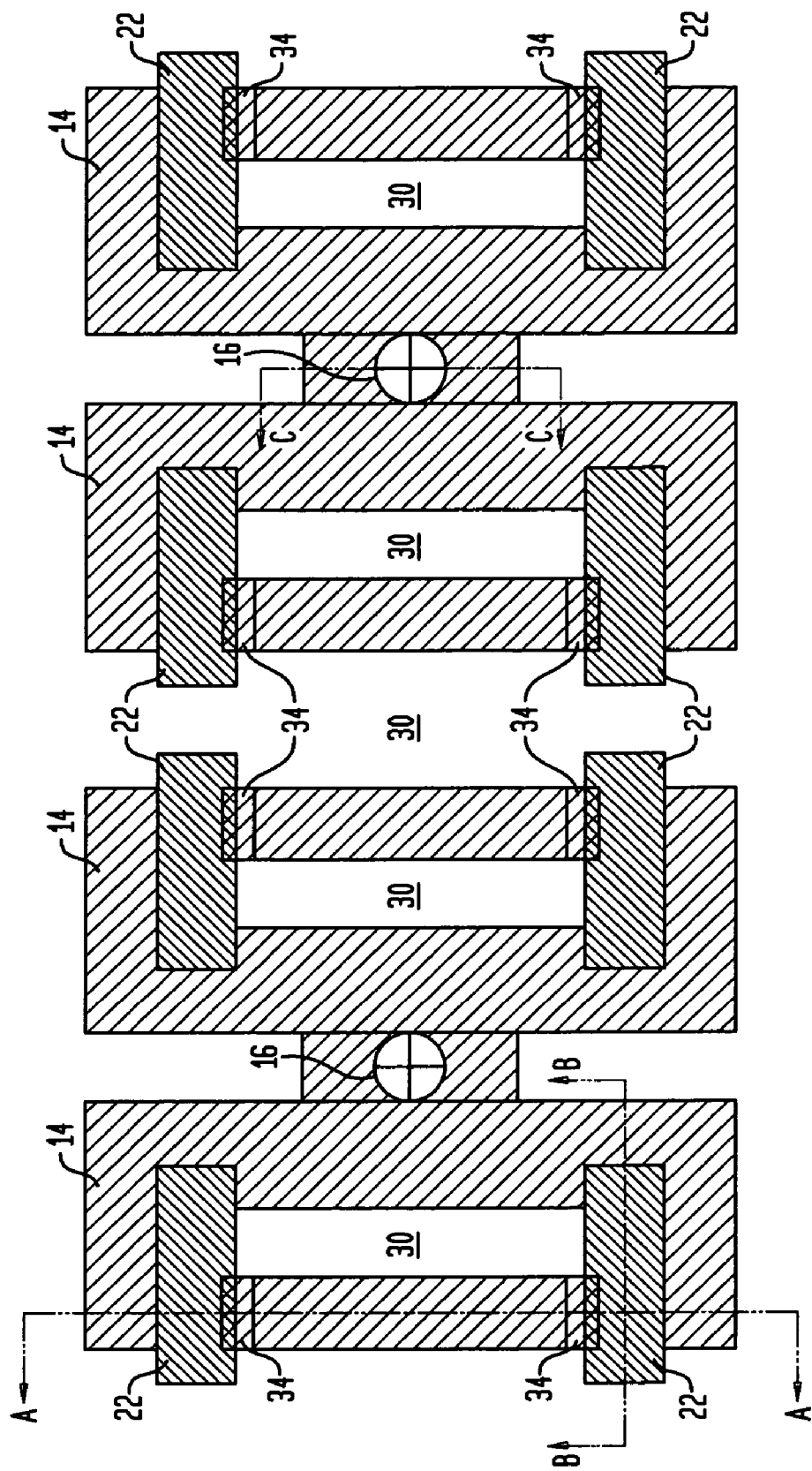
Figure 10:
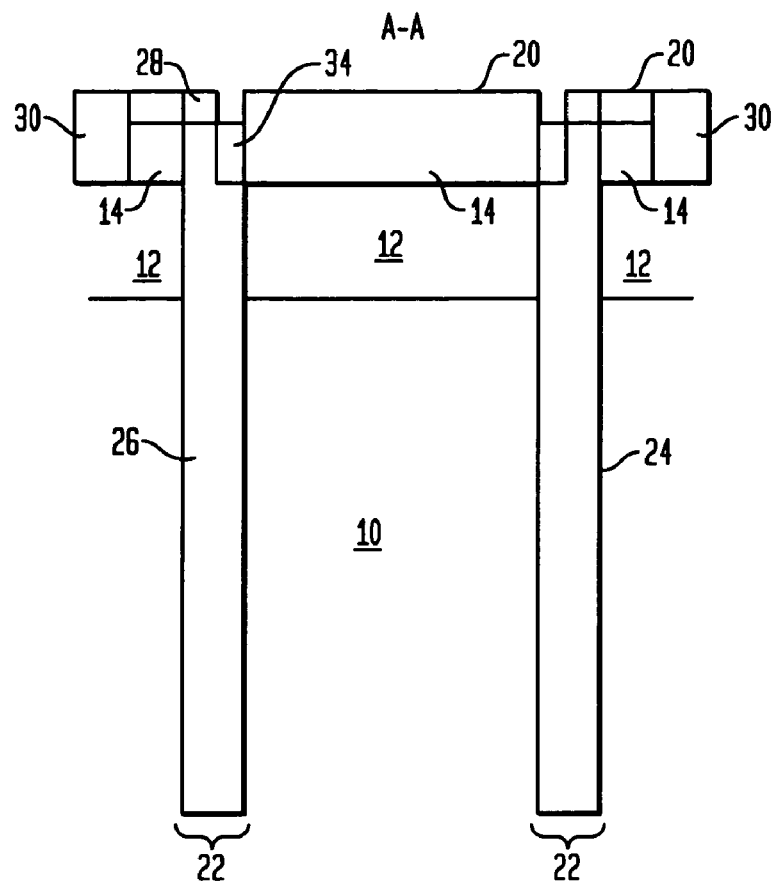
Figure 11:
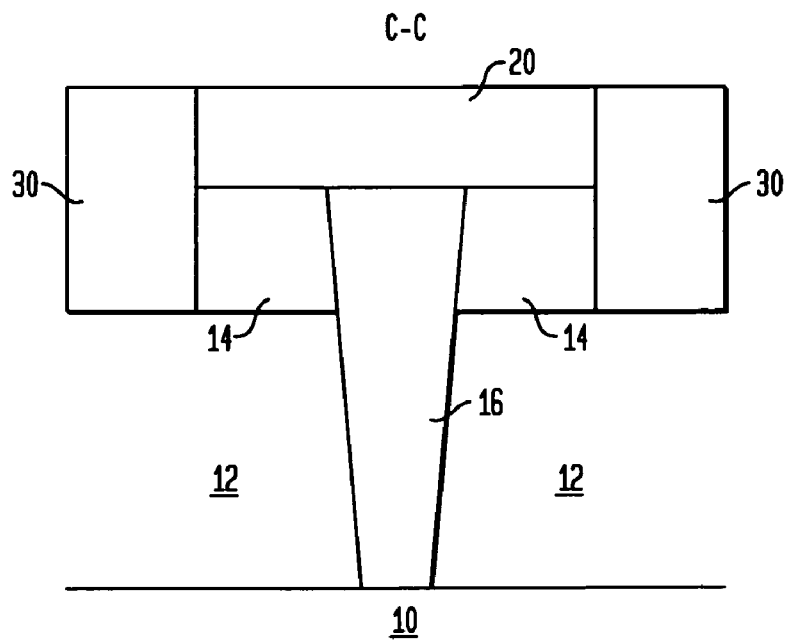

Next, the structure shown in FIGS. 5, 6 and 7 is formed. FIG. 5 shows a top down view of the structure, FIG. 6 is a cross sectional view through cut A-A and FIG. 7 is a cross sectional view through cut C-C. The structure shown in these different views is formed by first providing a pad stack 20 atop the SOI substrate that includes the via contacts 16. The pad stack 20 includes a lower oxide layer and an upper nitride layer. The lower oxide layer is typically $SiO_2$ and the upper nitride layer of the pad stack 20 is typically $Si_3N_4$.

The lower oxide layer of the pad stack 20 is typically a thin layer, relative to the upper nitride layer, whose thickness is typically from about 1 to about 10 nm, with a thickness from about 3 to about 7 nm being even more typical. The lower oxide layer of the pad stack 20 can be formed by a deposition process such as, for example, CVD or PECVD. Alternatively, the lower oxide layer of the pad stack 20 can be formed by a thermal oxidation process. The upper nitride layer, which is generally thicker than the lower oxide layer, has a typically thickness from about 50 to about 500 nm, with a thickness from about 100 to about 300 nm being even more typical. The upper nitride layer of the pad stack 20 can be formed by a conventional deposition process such as, for example, CVD or PECVD. It is observed that the pad stack 20 is subsequently used in the present invention for delineation of storage trenches and isolation regions. An additional pad layer of deposited silicon oxide may optionally be formed on top of the pad nitride layer. The optional silicon oxide pad layer serves to protect the pad nitride during etching of the storage trenches.

Storage trenches 22 are then formed using standard well-known processes including, for example, etching through the SOI layer 14, the buried insulating 12 and a portion of the substrate layer 10 to a desired depth. The desired depth of each of the storage trenches 22 is determined by a number of factors including, for example, the depth of the SOI layer and the buried insulating layer as well as the modest storage capacitance requirements of the gain cell. A typical depth for the storages trenches 22 formed at this point of the present invention is from about 0.50 to about 8.0 µm, with a depth from about 1.0 to about 3.0 µm being even more typical. It is noted that the depth of the storage trenches 22 is much less than what is usually used in a conventional trench storage DRAM.

A first dielectric, e.g., the storage dielectric, 24 is then formed on the interior surfaces of the storage trenches 22 utilizing techniques well known in the art. For example, first dielectric 24 can be formed by CVD, PECVD or another like deposition process. Alternatively, the first dielectric 24 can be formed by thermal growth. The first dielectric 24 can be an oxide such as, for example, $SiO_2$, $Al_2O_3$, $Ta_2O_3$, $TiO_2$ or any other metal oxide or mixed metal oxide. Examples of mixed metal oxides that can be used as the first dielectric 24 include perovskite-type oxides. Multilayers of the aforementioned dielectric materials can be used as the first dielectric 24 as well. In a preferred embodiment, the first dielectric 24 is $SiO_2$.

The thickness of the first dielectric 24 may vary depending on the process used in forming the same, the material and number of layers of the first dielectric 24. Typically, the first dielectric 24 has a thickness from about 0.5 to about 3 nm, with a thickness from about 1 to about 2 nm being even more typical. The first dielectric 24 is used as storage node dielectric. It may also serve as the sidewall dielectric of the side-gated MOSFET, i.e., T2. The first dielectric 24 may also comprise other insulators, such as silicon nitride, or layers of above-mentioned insulators.

Next, the storage trenches 22 including the first dielectric 24 are filled with a node conductor 26 which is typically doped polysilicon. Other types of node conductors, such as metallic conductors and silicides, may also be used in place of polysilicon or in conjunction with polysilicon in the present invention. The node conductor 26 is formed into the storage trenches using a conventional deposition process such as, for example, CVD or PECVD. When doped polysilicon is used, an in-situ doping deposition process can be used. Alternatively, and when doped polysilicon is used as the node conductor 26, the doped polysilicon can be formed by deposition and ion implantation.

Following the deposition step, the node conductor 26 is planarized by conventional means and recessed to a depth approximately level with the upper surface of the SOI layer 14.

An oxide cap 28 is formed atop the storage node conductor 26 using techniques that are well known in the art. Typically, a TEOS (tetraethylorthosilicate) or a high density plasma (HPD) oxide is deposited and planarized to the top of the upper nitride layer of the pad stack 20.

Isolation regions 30 are now formed into the structure shown in FIGS. 5, 6 and 7. The leaves islands of active area within which the MOSFETs will be subsequently formed. The isolation regions 30 are formed utilizing techniques well known in the art. Specifically, the isolation regions 30 are formed by applying a photoresist atop the pad stack 20, exposing the photoresist to a trench pattern, developing the trench pattern in the photoresist, etching exposed portions of the pad stack 20 exposing a portion of the SOI layer 14, and etching through the exposed portion of the SOI layer 14 stopping on the buried insulating layer 12. The photoresist is typically removed after the trench pattern has been transferred into the pad stack 20. Various etching processes including, for example, dry etching, chemical wet etching or any combination thereof may be used in providing the trench pattern into the SOI substrate. The trench may be optionally lined with a trench liner such as $SiO_2$ or $Si_3N_4$, or multiple layers of such dielectrics. The trench, with or without the trench liner, is then filled with a trench dielectric such as an oxide. Typically, the trench dielectric is TEOS or HPD oxide. After filling the trench with a trench dielectric, an optional planarization process such as CMP can be used to provide a structure in which the upper surface of each of the isolation regions 30 is substantially coplanar with the upper nitride layer of the pad stack 20. The structure including the trench isolation regions 30 is shown in FIGS. 8, 9,10 and 11.

After forming the trench isolation regions 30, a conductive strap 34, which serves to connect the storage node conductor 26 to the write MOSFET T1 (to be subsequently formed), is formed. Specifically, the conductive strap 34 is formed by first forming a window in the oxide cap 28 of the storage trench 22 in an area adjacent to which the write MOSFET T1 will be formed using a strap mask 36 and etching. The etching is typically performed by a dry etching process such as RIE. This etching step exposes a portion of the underlying node conductor 26. The portion of the node conductor 26 now exposed by the window in the oxide cap 28 is recessed by etching to a depth that is approximately at the back interface of the SOI layer 14. The exposed portion of the first dielectric 24 within the storage trench 22 is removed utilizing an etching process that is selective for removing the first dielectric 24. This etching step exposes sidewalls of the SOI substrate, particularly, sidewalls that are comprised of the SOI layer 14. A conductive plug typically comprising polysi or another conductive material is formed in the recessed area utilizing a conventional deposition process. Following deposition of the conductive plug, a planarization process is typically performed that provides a structure in which the conductive plug has an upper surface that is substantially coplanar to an upper surface of the upper nitride layer of the pad stack 20. Next, the planarized conductive plug is recessed by etching to approximately the top surface of the SOI layer 14. This conductive plug forms the conductive strap 34 between the storage node conductor 26 and the write MOSFET T1. The structure including the conductive strap 34 is also shown in FIGS. 8, 9, 10 and 11. These drawings include two top views (one after isolation region, FIG. 8 and the other after strap formation, FIG. 9), a cut through A-A, FIG. 10, and through C-C, FIG. 11, following the above described steps.

In one embodiment (not shown), the recess at the top of the storage trench 22 is then refilled with oxide, planarized and recessed using processing techniques well known to those skilled in the art. These processing steps form a top trench oxide 38 in each of the storage trenches 22. The top trench oxide 38 is typically formed utilizing a conventional deposition process and the top trench oxide 38 typically has a thickness from about 20 to about 50 nm. Note that the top trench oxide 38 provides isolation between the node conductor and an overlying wordline conductor of the read transistor T2.

Figure 12:
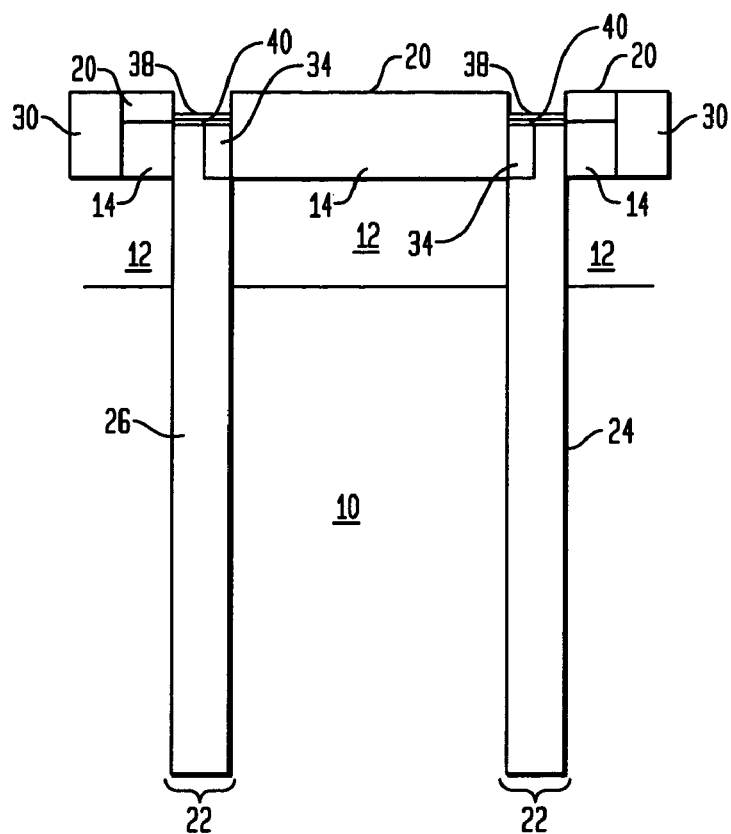

Optionally, the remaining portion of the oxide plug may be entirely removed and a thin nitride layer (having a thickness of about 20 nm or less) may be formed by a conventional deposition process atop the storage node conductor 26. The optional step, which is preferred in the present invention, is shown in FIG. 12 where reference numeral 40 is used to denote the thin nitride layer. The purpose of the thin nitride layer 40 between the top trench oxide (TTO) 38 and the top of the storage node conductor 26 is to assure that an insulator remains on top of the storage node conductor 26 after subsequent processing. Without the optional nitride layer 40, it is likely that the TTO 38 will be severely eroded by later processing steps. Thus, the optional nitride layer 40 assures that there are no shorts between the storage node conductor 26 and the overlying passing wordline to be subsequently formed. The optional nitride layer 40 is removed from the top of the isolation regions 30 by planarization processes.

Figure 13:
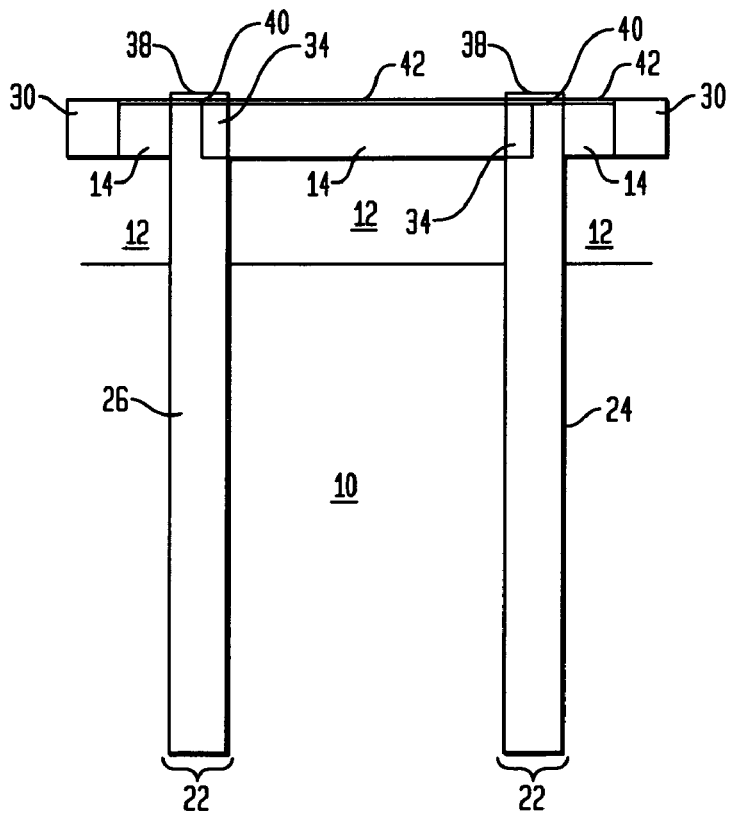
Figure 14:
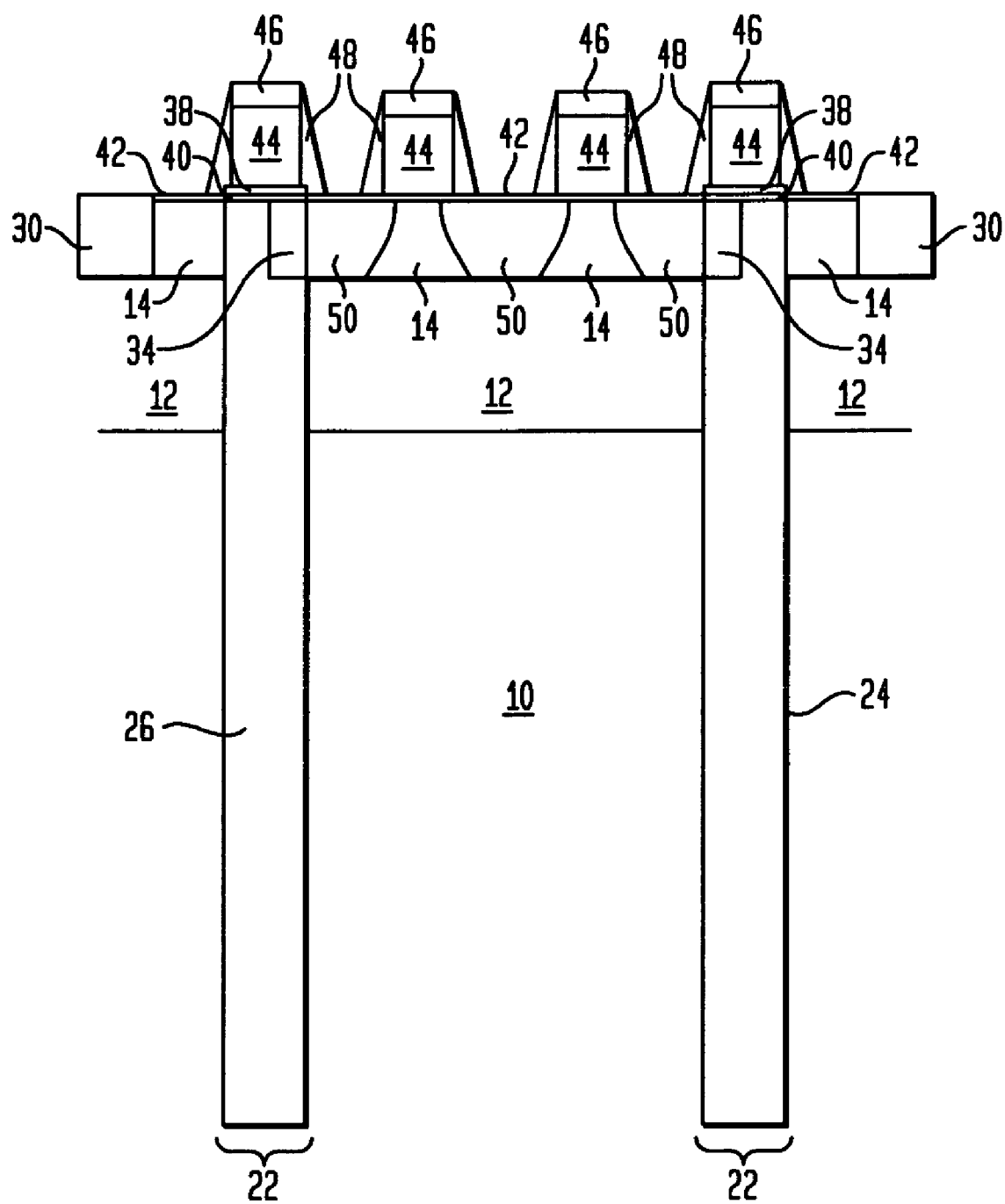

In a standard manner, the upper nitride layer of the pad stack 20 is removed and the upper surface of the SOI layer 14 is cleaned using one of the many conventional cleaning techniques that are well known in the art. During this cleaning process, the lower oxide layer of the pad stack 20 is typically removed. A transfer gate oxide is then formed on the cleaned surface of the SOI layer 14 utilizing a conventional thermal growing process such as oxidation. The transfer gate oxide is typically $SiO_2$. The thickness of the transfer gate oxide may vary, but typically the transfer gate oxide has a thickness from about 1.5 to about 7 nm, with a thickness from about 2 to about 5 nm being even more typical. The structure including the transfer gate oxide is shown in FIG. 13 where reference numeral 42 is used to denote the transfer gate oxide. It is noted that the transfer gate oxide 42 serves as the gate dielectric of the write wordlines, T1.

Next, a wordline conductor 44 is formed atop the surface of the transfer gate oxide 42 and the top trench oxide 38 using a conventional deposition process such as CVD or PECVD. The wordline conductor is comprised of a conductive material such as doped polysilicon, a conductive metal, a conductive metal alloy, a conductive metal silicide, a conductive metal nitride or multilayers thereof. Typically, the wordline conductor 44 is comprised of n-doped polysilicon. In the embodiments where a polysilicon gate conductor is employed, a silicide layer (not specifically shown) can be formed atop the polysilicon gate conductor utilizing a conventional silicidation process which includes, for example, deposition of a silicide metal (e.g., Ti, W, or Ni), annealing at a first temperature to form a metal silicide, removing excess metal that does not react with the polysilicon by a selective etching process, and optionally performing a second anneal at a second temperature.

A wordline cap 46 comprised of SiN or another like dielectric material is then typically deposited atop the wordline conductor 44. The wordline cap 46 serves as a protective cap over the wordlines for the formation of borderless diffusion contacts. The gate stack including layers 44 and 46 is then patterned and etched using processing techniques well known in the art. These steps form the write wordlines (WWLs) and the read wordlines (RWLs) of the inventive structure. Note that the RWLs are located over the storage trenches 22 and the WWLs are located atop the SOI layer 14. This is shown, for example, in FIG. 14.

A gate spacer 48 comprised of at least one insulator, preferably a nitride, is formed utilizing a conformal deposition process, followed by reactive ion etching or another like etching process. An optional gate sidewall oxide (not shown) can be formed by a thermal oxidation process prior to gate spacer 48 formation. The gate spacer 48 may comprise a single insulator material or a combination of more than one insulator material. The gate spacer 48 has a width, as measured at the bottom surface that lies above the SOI layer or the storage trenches, from about 1 to about 20 nm, with a width from about 4 to about 10 nm being more typical.

Source/drain regions 50 are then formed into the SOI layer 14 at the footprint of the write wordlines using conventional ion implantation and annealing. The source/drain regions 50 are preferably n-type when the wordline conductor is n-type, and p-type when the wordline conductor is p-type. The resultant structure that is formed after wordline formation, gate spacer formation and source/drain formation is shown, for example, in FIG. 14.

Figure 15:
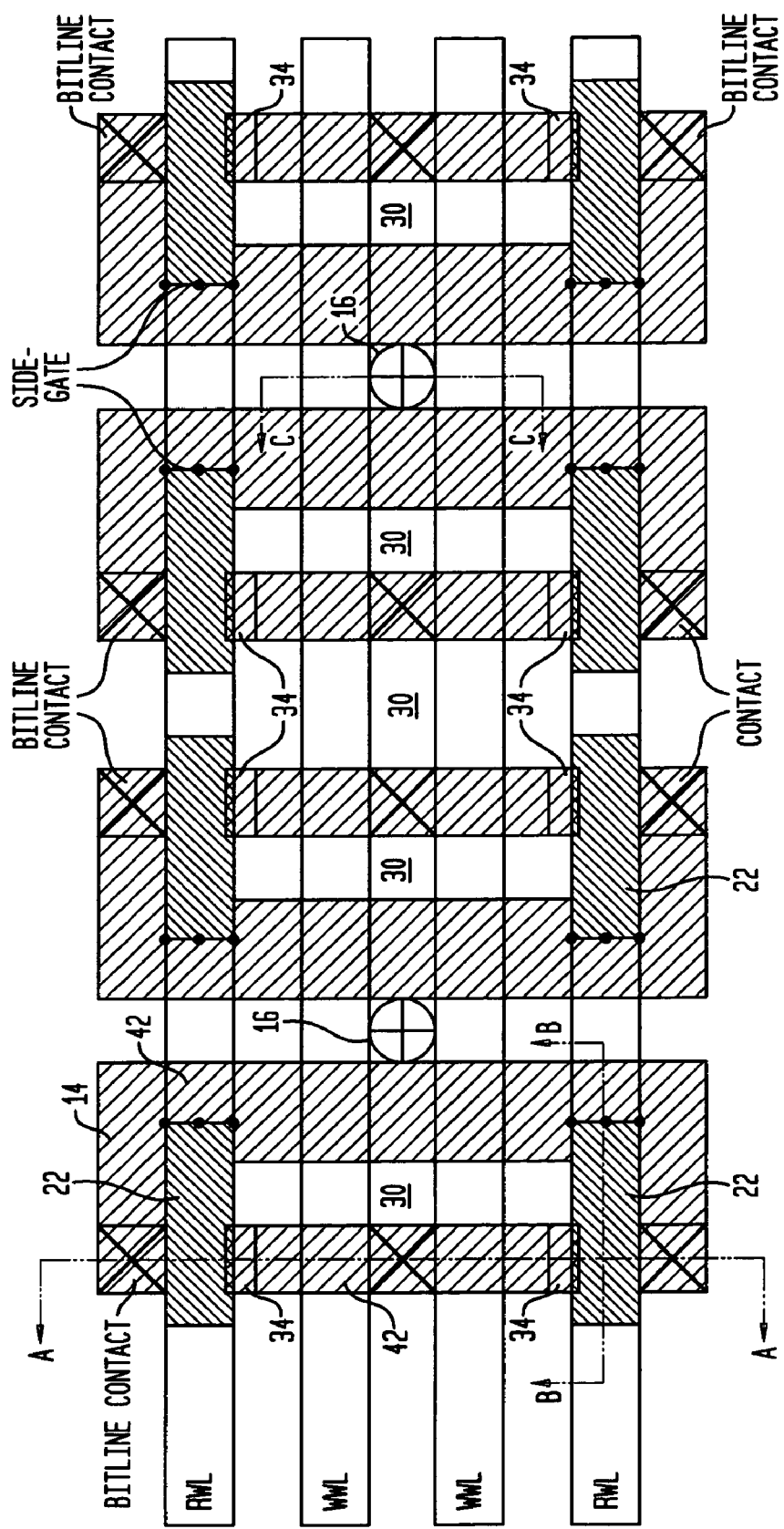

An interlayer dielectric 52 such as an oxide is then deposited over the structure and planarized by conventional techniques well known in the art. Bitline (BL) contact openings are then formed through the interlayer dielectric 52 and any transfer gate oxide 42 remaining over the source/drain regions 50. The BL contact openings are formed via lithography and etching. FIG. 15 shows a top down view following opening of the BL contacts. It is observed that the BL contact openings are borderless to the wordlines formed above. In the drawing, the sidewall gate dielectric comprising the first dielectric 24 of read wordline MOSFET T2 is shown by a series of vertical dots. Region 54 in FIG. 19 shows the borderless bitline contacts.

Figure 16:
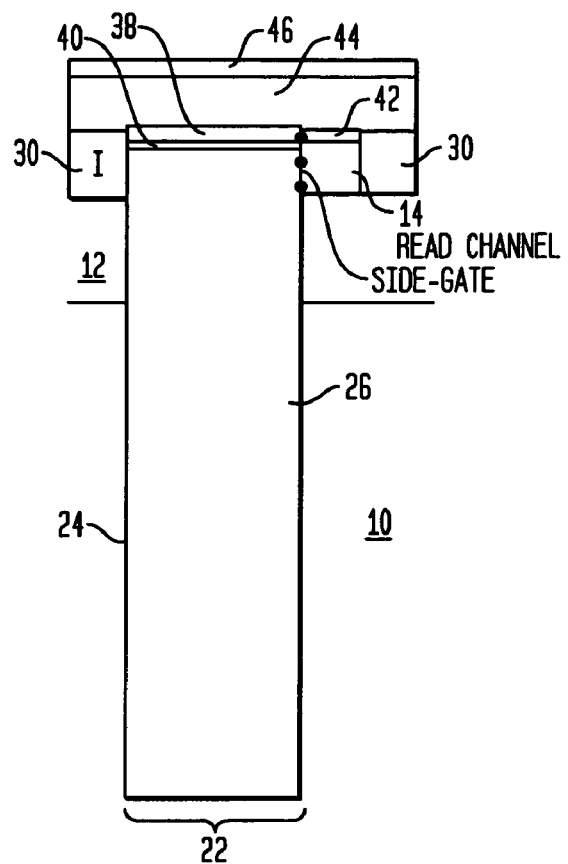
Figure 17:
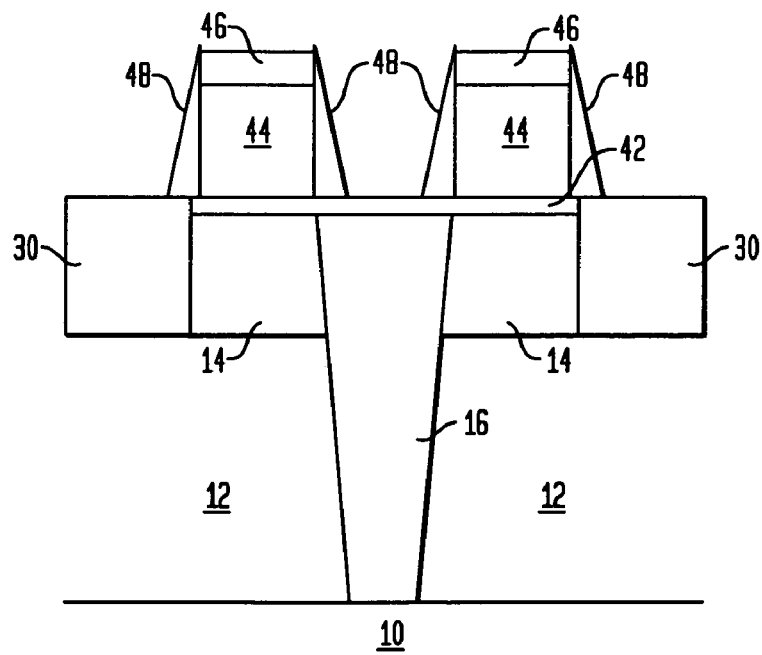

A cut through section B-B is shown in FIG. 16 to clearly show the structure of the read MOSFET T2. Note that the read channel is side-gated directly from the storage node conductor 26. This is a key feature of the present invention. It is further observed that the read MOSFET T2 is double gated 1) on the sidewalls by the storage node conductor 26, and 2) on its top surface by the RWL gate conductor. The two gate dielectrics of T2 thus include dielectric 24 and transfer gate oxide 42. As shown, the TTO 38 insulates the trench storage node conductor 26 from the RWL. FIG. 17 shows the wordlines passing over the SOI layer 14 in the via contact 16 region. The SOI layer 14 under the wordlines in the region including the via contact 16 provides continuity between the read transistor and ground.

Figure 18:
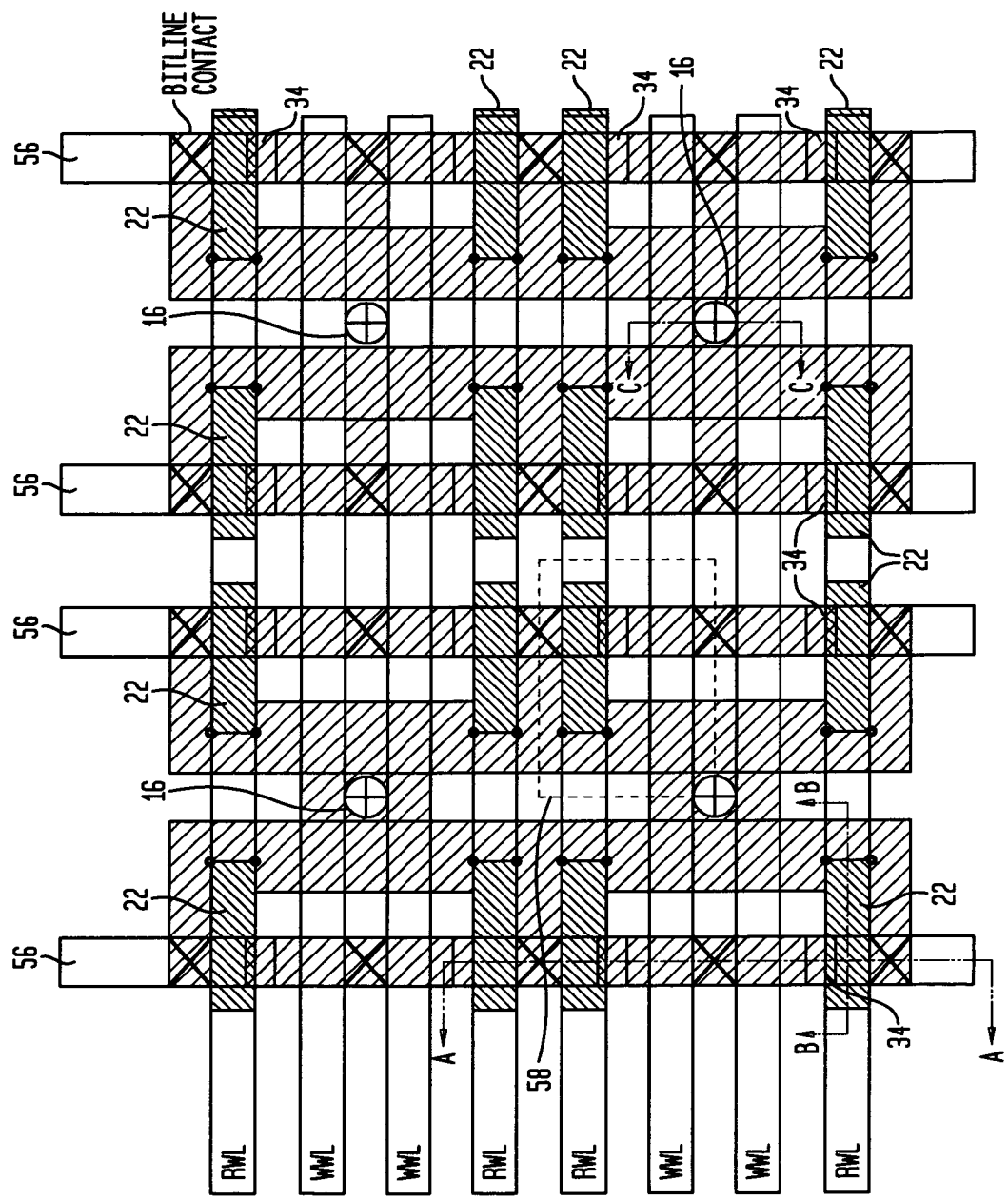
Figure 19:
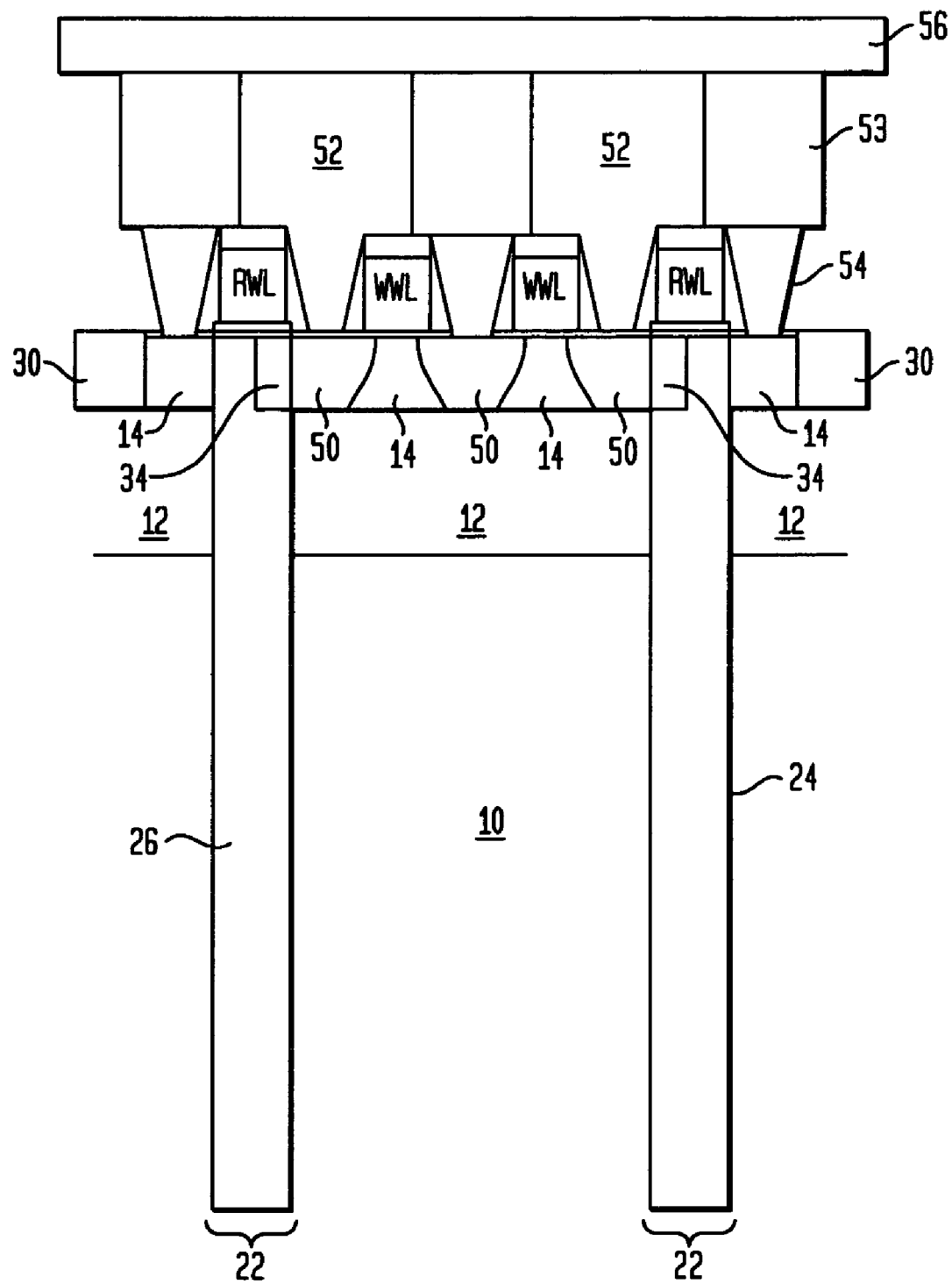

Bitlines 56, which comprises W or another like conductor, are then formed as is shown in FIGS. 18 and 19. Bitlines 56 are connected with region 54 through contacts 53 that are comprised of a metal. The bitlines 56 are formed using techniques that are well known to those skilled in the art and are thus not described herein. A 20 $F^2$ unit cell is depicted by the area within the dotted boxed region 58. It is noted that support MOSFETs (not shown) can be easily integrated into the process flow described herein.

The above description which makes references to FIGS. 1-19 describes the first embodiment of the present invention. The following description which makes reference to FIGS. 20, 21 and 22A-22C describes a second embodiment of the present invention. In the second embodiment of the present invention, a cell layout is provided in which the read MOSFET transistor T2 is doubly gated with a read wordline gate on the top surface and a side-gate which is the actual node conductor of the storage node conductor of the storage capacitor and is directly coupled to the read MOSFET.

The side-gating by the storage capacitor modulates the threshold voltage of the read MOSFET. When a "1" is stored, the Vt of the read transistor is low. When a "0" is stored, the Vt of the read transistor is high. A "1" is distinguished from a "0" by the resistance of the read MOSFET when the read wordline is raised. Thus, low-voltage sensing is feasible, as no transfer of charge between the storage capacitor and the write bitline is required.

The inventive cell of the second embodiment is a dual ported design, allowing simultaneous write and read of data from a cell. The cell of the first embodiment described above is single ported.

Figure 20:
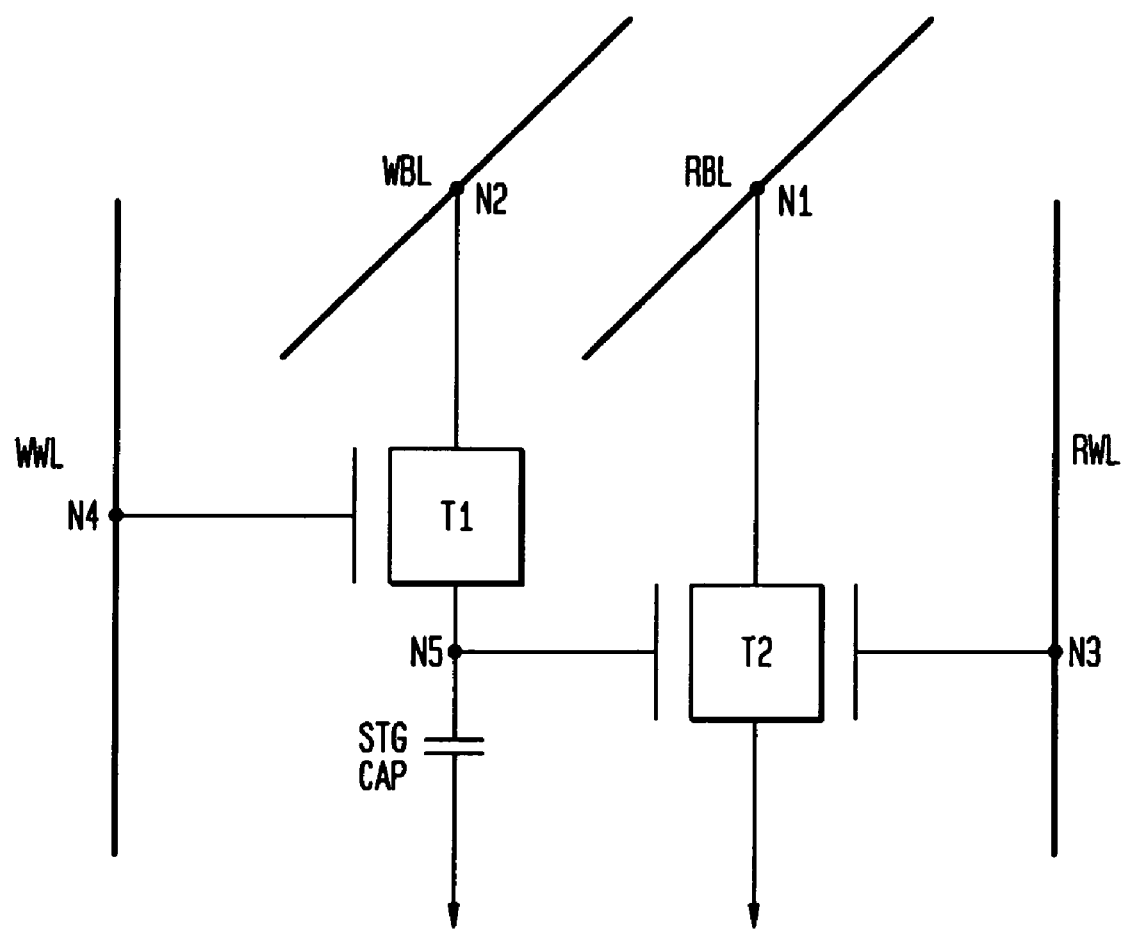
FIG. 20 is a schematic showing a two transistor (2T)/one capacitor (1C) dual port gain cell with a double gated read device in accordance with a second embodiment of the present invention.

FIG. 20 is a schematic of the inventive gain cell of the second embodiment of the present invention. Note that in the inventive gain cell shown in FIG. 20 the double-gated transistor T2 is also used. As indicated above, T2 includes two gates: a side-gate connected to the storage node of the storage trench capacitor STG CAP and a top gate connected to the RWL. This design is dual ported since a write operation, utilizing WWL and WBL, may occur simultaneously with a read, using RWL and RBL, for access. N1 . . . N5 are also shown in FIG. 20.

T1 is the write transistor and is a conventional MOSFET. A "1" or "0" is written to the storage capacitor by raising the write wordline (WWL) and transferring charge between the write bitline (WBL) and the storage capacitor. The node of the storage capacitor serves as one of the two gates of the read MOSFET T2. In this embodiment of the present invention, the node N5 gating the sidewall of T2 is integrated with the storage capacitor (STG CAP) and forms a compact structure by itself. This enables the dense cell layout disclosed in the second embodiment of the present invention. It is again observed that the cell shown in FIG. 20 is dual ported.

Figure 21:
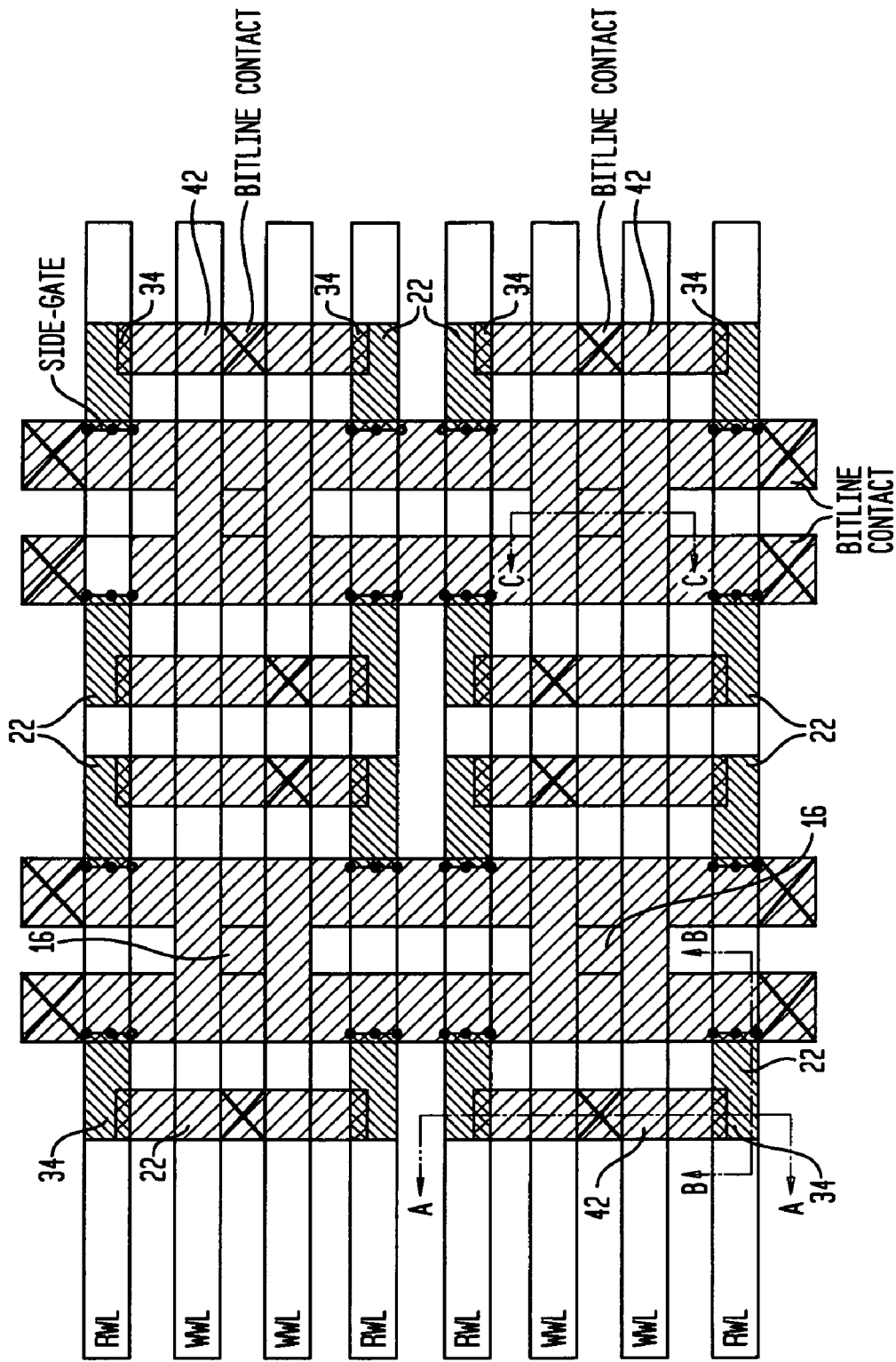
FIG. 21 is a top down view showing the layout of a portion of the memory cell in accordance with a second embodiment of the present invention.

FIG. 21 shows a layout (top down view) of a portion of the memory array showing sixteen memory cells, M1 . . . M16. For clarity, the bitlines are not shown. In this layout, a ground contact is provided between the SOI layer 14 and the substrate 10 by a via contact 16 through buried insulator 12. Each via contact 16 is shared by four cells and provides a path to ground for the read current. Contacts between bitlines running vertical on the layout (not shown) and the active region are denoted by an 'X'. Read (RWL) and write (WWL) wordlines run horizontally on the layout. Note the side-gate (denoted by a series of vertical dots) of the read MOSFET T2, with RWL running over the top gated surface. It is noted that the other elements shown in FIG. 21 include reference numerals that are consistent with the reference numerals described above for the first embodiment of the present invention.

Each memory cell of the second embodiment of the present invention includes a first transistor T1 provided with a gate, a source, and a drain respectively coupled to a write wordline (WWL) of a memory array, a first node, and a write bitline of said memory array; a second transistor (T2) having a first gate, a second gate, a source, and a drain respectively coupled to a read wordline, to said first node, to a voltage source and a read bitline; and a capacitor (STG CAP) having a first terminal connected to said first node and a second terminal connected to a voltage source, wherein first terminal of said capacitor and the second gate of said second transistor comprise a single entity.

Figure 22A:
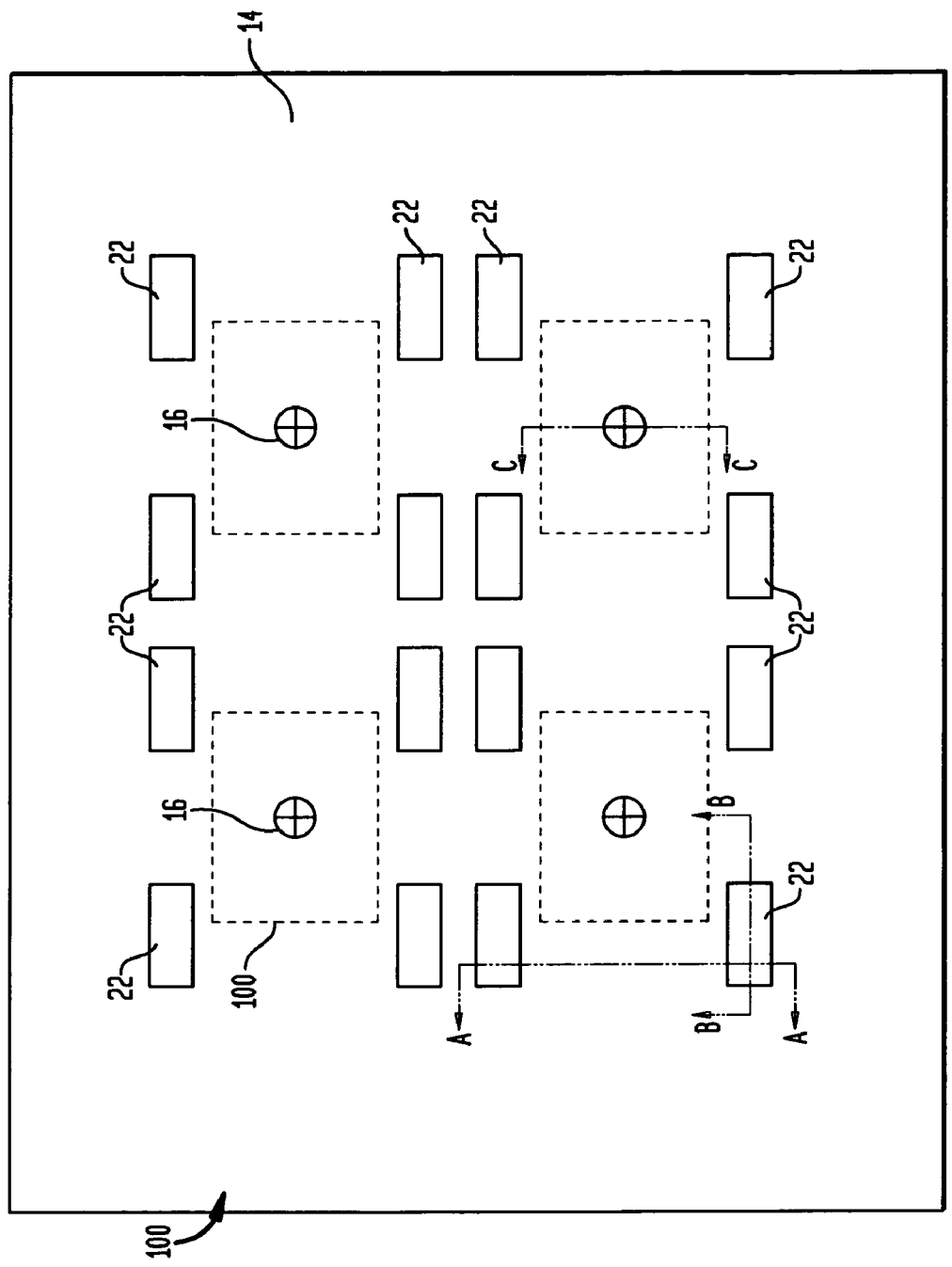

The process flow used in forming the layout shown in FIG. 21 is similar to that shown in the first embodiment except that the initial structure shown in FIGS. 22A-22C is used in place of the structure shown in FIG. 2. The remaining steps of the first embodiment of the present invention depicted in FIGS. 3-19 are applicable and are used in providing the final structure. FIGS. 22A-22C show the initial structure following the formation of via contacts 16 between the SOI layer 14 and the substrate 10, and after the formation of the storage trench capacitor which includes storage trench 22, first dielectric 24 and node conductor 26. An implant block mask is used to form doped regions 100 surrounding the via contacts 16. The doped regions 100, which are preferably n-doped regions, will later form a connection for the read current path under the passing write wordline (WWL).

The structure shown in FIGS. 22A-22C is formed as follows: First, a via mask (not shown) is used to pattern a photoresist layer and an underlying hardmask for defining the location of the via contacts 16. Using techniques well known in the art (and as described above), the via contacts 16 are etched through the SOI layer 14 and the buried insulating layer 12, stopping on the semiconductor substrate 10. The via is filled with doped polysilicon as described above, planarized and recessed to a depth approximately level with the original SOI layer 14. Optionally, a conductive barrier can be formed into the via opening prior to filling with doped polysilicon.

Next, a layer of photoresist is patterned by the block mask and dopants, preferably n-type dopants, are implanted into the open window regions forming dopant regions 100. The photoresist is stripped and the hardmask is removed.

The storage capacitor is then formed utilizing the processing steps described above in the first embodiment of the present invention. Processing continues as described above in FIGS. 3-19 of the first embodiment of the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A memory cell comprising:
   a first transistor having a gate, a first source, and a first drain;
   a second transistor having a first gate, a second gate, a second source, and a second drain;
   a trench located in a semiconductor-on-insulator (SOI) substrate including a stack of, from top to bottom, a semiconductor-on-insulator (SOI) layer, a buried insulator layer, and a bottom substrate layer; and a capacitor having a first terminal and a storage node dielectric, wherein said first terminal of said capacitor and said second gate of said second transistor comprise a single entity and located in said trench, and wherein said storage node dielectric laterally abuts said SOI layer, said buried insulator layer, and said bottom substrate layer at sidewalls of said trench.

2. The memory cell of claim 1 wherein said first transistor is coupled to a write wordline of a memory array, a first node, and a bitline of said memory array; said second transistor is coupled to a read wordline, to said first node, to a voltage source and said bitline; and said capacitor is connected to said first node and further including a second terminal connected to a voltage source.

3. The memory cell of claim 2 wherein said second transistor contains a first surface and a second surface, wherein the first surface of said second transistor is horizontally oriented, and the second surface of said second transistor is vertically oriented.

4. The memory cell of claim 3 wherein a proximal end of said first surface is adjacent to a proximal end of said second surface, and a distal end of said first surface is adjacent to a distal end of said second surface.

5. The memory cell of claim 2 wherein the source of said second transistor is located on one of a proximal end or a distal end, and the drain of said second transistor is located on the other of the proximal end or the distal end.

6. The memory cell of claim 2 wherein the first gate of said second transistor is disposed on said first surface, and the second gate of said second transistor is disposed on said second surface.

7. The memory cell of claim 2 wherein said single entity is a capacitor electrode.

8. The memory cell of claim 1 wherein said first transistor is coupled to a write wordline of a memory array, a first node, and a write bitline of said memory array; said second transistor is coupled to a read wordline, to said first node, to a voltage source and a read bitline; and the first terminal of said capacitor is connected to said first node and said capacitor further includes a second terminal connected to a voltage source.

9. The memory cell of claim 8 wherein said second transistor contains a first surface and a second surface, wherein the first surface of said second transistor is horizontally oriented, and the second surface of said second transistor is vertically oriented.

10. The memory cell of claim 9 wherein a proximal end of said first surface is adjacent to a proximal end of said second surface, and a distal end of said first surface is adjacent to a distal end of said second surface.

11. The memory cell of claim 8 wherein the source of said second transistor is located on one of a proximal end or a distal end, and the drain of said second transistor is located on the other of the proximal end or the distal end.

12. The memory cell of claim 9 wherein the first gate of said second transistor is disposed on said first surface, and the second gate of said second transistor is disposed on said second surface.

13. The memory cell of claim 8 wherein said single entity is a capacitor electrode.

14. A memory cell comprising:
a first transistor having a gate, a first source, and a first drain;
a second transistor having a top gate, a side gate, a second source, and a second drain;
a trench located in a semiconductor-on-insulator (SOI) substrate including a stack of, from top to bottom, a semiconductor-on-insulator (SOI) layer, a buried insulator layer, and a bottom substrate layer; and
a capacitor having a first terminal and a storage node dielectric, wherein the first terminal of said capacitor and said second side gate of said second transistor comprise a single entity and located in said trench, and wherein said storage node dielectric laterally abuts said SOI layer, said buried insulator layer, and said bottom substrate layer at sidewalls of said trench.

15. The memory cell of claim 1 wherein said second source and said second drain are located above an entirety of said buried insulator layer.

16. The memory cell of claim 1 wherein a portion of said storage node dielectric is located in said bottom substrate layer.

17. The memory cell of claim 14 wherein said second source and said second drain are located above an entirety of said buried insulator layer.

18. The memory cell of claim 14 wherein a portion of said storage node dielectric is located in said bottom substrate layer.

19. The memory cell of claim 1 wherein said trench extends from a top surface of said SOI layer, though an entirety of said buried insulator layer, and into said bottom substrate layer.

20. The memory cell of claim 14 wherein said trench extends from a top surface of said SOI layer, through an entirety of said buried insulator layer, and into said bottom substrate layer.

* * * * *